(12) United States Patent
Boss

(10) Patent No.: US 10,082,553 B2
(45) Date of Patent: Sep. 25, 2018

(54) MRI PHANTOM, METHOD FOR MAKING SAME AND ACQUIRING AN MRI IMAGE

(71) Applicant: NATIONAL INSTITUTE OF STANDARDS AND TECHNOLOGY, Gaithersburg, MD (US)

(72) Inventor: Michael A. Boss, Boulder, CO (US)

(73) Assignee: NATIONAL INSTITUTE OF STANDARDS AND TECHNOLOGY, Gaithersburg, MD (US)

( * ) Notice: Subject to any disclaimer, the term of this patent is extended or adjusted under 35 U.S.C. 154(b) by 588 days.

(21) Appl. No.: 14/802,419

(22) Filed: Jul. 17, 2015

(65) Prior Publication Data

US 2015/0323639 A1 Nov. 12, 2015

Related U.S. Application Data

(60) Provisional application No. 62/064,494, filed on Oct. 16, 2014.

(51) Int. Cl.
*G01R 33/58* (2006.01)
*G01R 33/50* (2006.01)

(52) U.S. Cl.
CPC ............. *G01R 33/58* (2013.01); *G01R 33/50* (2013.01); *Y10T 29/49828* (2015.01)

(58) Field of Classification Search
CPC ............ G01R 33/34007; G01R 33/341; G01R 33/385
See application file for complete search history.

(56) References Cited

U.S. PATENT DOCUMENTS

| 8,134,363 | B2 * | 3/2012 | Yanasak | G01R 33/58 |
| | | | | 324/307 |
| 9,603,546 | B2 | 3/2017 | Horkay et al. | |
| 9,851,426 | B2 * | 12/2017 | Chenevert | G01R 33/56341 |
| 2003/0086535 | A1 * | 5/2003 | Teppaz | A61B 6/583 |
| | | | | 378/207 |

(Continued)

FOREIGN PATENT DOCUMENTS

WO 2010087596 A2 7/2010

*Primary Examiner* — Giovanni Astacio-Oquendo
*Assistant Examiner* — Alvaro Fortich
(74) *Attorney, Agent, or Firm* — Office of Chief Counsel for National Institute of Standards and Technology

(57) ABSTRACT

A magnetic resonance imaging (MRI) phantom includes an outer container that includes a first portion comprising a first wall; a second portion opposingly disposed to the first portion and sealingly engaged to the first portion, the second portion including a second wall; and an internal volume bounded by the first wall and the second wall, the internal volume being hollow and configured to receive a fluid; and a sample holder disposed in the internal volume of the outer container, wherein the MRI phantom is configured to maintain a constant temperature of the internal volume. A process for acquiring an MRI image includes providing an MRI; disposing a sample member in the sample holder; disposing a fluid in the MRI phantom; disposing the MRI phantom in an MRI device; achieving thermal equilibrium in the MRI phantom at a selected temperature; and subjecting the MRI phantom to MRI imaging at the selected temperature to acquire the MRI image of the sample.

11 Claims, 30 Drawing Sheets

(56) References Cited

U.S. PATENT DOCUMENTS

| | | | |
|---|---|---|---|
| 2005/0008126 A1* | 1/2005 | Juh | A61B 6/12 378/207 |
| 2005/0052183 A1* | 3/2005 | Paliwal | G01R 33/4804 324/315 |
| 2005/0110490 A1* | 5/2005 | Zhao | G01R 33/32 324/311 |
| 2008/0269594 A1* | 10/2008 | Paul | G01R 33/481 600/411 |
| 2009/0309593 A1* | 12/2009 | Steen | G01R 33/3875 324/307 |
| 2010/0195233 A1* | 8/2010 | Kim | D01D 5/36 359/896 |
| 2012/0040322 A1* | 2/2012 | Eberler | G01R 33/58 434/267 |
| 2012/0068699 A1* | 3/2012 | Horkay | A61B 5/055 324/300 |
| 2015/0137813 A1* | 5/2015 | Chenevert | G01R 33/56341 324/322 |
| 2017/0184696 A1* | 6/2017 | Zuccolotto | G01R 33/58 |

\* cited by examiner

MRI PHANTOM, METHOD FOR MAKING SAME AND ACQUIRING AN MRI IMAGE

CROSS REFERENCE TO RELATED APPLICATIONS

This application claims the benefit of U.S. Provisional Patent Application Ser. No. 62/064,494 filed Oct. 16, 2014, the disclosure of which is incorporated herein by reference in its entirety.

STATEMENT REGARDING FEDERALLY SPONSORED RESEARCH

This invention was made with United States government support from the National Institute of Standards and Technology. The government has certain rights in the invention.

BRIEF DESCRIPTION

Disclosed is a magnetic resonance imaging (MRI) phantom comprising: an outer container comprising: a first portion comprising a first wall; a second portion opposingly disposed to the first portion and sealingly engaged to the first portion, the second portion comprising a second wall; and an internal volume bounded by the first wall and the second wall, the internal volume being hollow and configured to receive a fluid; and a sample holder disposed in the internal volume of the outer container, wherein the MRI phantom is configured to maintain a constant temperature of the internal volume.

Also disclosed is a process for making a magnetic resonance imaging (MRI) phantom, the process comprising: disposing a sample holder on a second portion that comprises a second wall, the sample holder comprising a sample receiver to receive a sample member to be subjected to magnetic resonance imaging; and disposing a first portion on the sample holder and the second portion to form an outer container comprising: the first portion disposed on the second portion and comprising a first wall; and an internal volume bounded by the first wall and the second wall.

Further disclosed is a process for acquiring a magnetic resonance imaging (MRI) image, the process comprising: providing an MRI phantom that comprises: a second portion; a first portion disposed on the second portion; and a sample holder disposed in the second portion in the first portion; disposing a sample member in the sample holder, the sample member comprising a sample; disposing a fluid in the MRI phantom; disposing the MRI phantom in an MRI device; achieving thermal equilibrium in the MRI phantom at a selected temperature; and subjecting the MRI phantom to MRI imaging at the selected temperature to acquire the MRI image of the sample.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a magnetic resonance imaging (MRI) phantom disclosed herein provides a structure having an internal volume and sample receiver disclosed therein for disposal of a sample in the MRI phantom and from which MRI data is acquired for determination of performance of an MRI device. Such determination can provide a comparison between the quality of operation of the MRI device over time as well as performance of the MRI device between another MRI device or comparison of MRI data to a standard image or data set, and the like. MRI data acquired using the MRI phantom can be used to validate disease mechanisms and treatments or reduce medical costs and provision of imaging service by improving image quality and reliability. The MRI phantom can be used in multisite clinical trials for quantitative MRI or to test efficacy of novel drugs.

Beneficially, images taken on different MRI machines are rendered directly comparable when acquired using the MRI phantom herein because the MRI phantom can be subjected to imaging over a time interval. Further, the MRI phantom provides MRI data of diffusion, e.g., of a fluid such as water in a presence of a constant or substantially constant temperature in the MRI phantom without inclusion of a thermal effect on the fluid. In a particular embodiment, a process for diffusion-weighted magnetic resonance imaging (MRI) includes using the MRI phantom to determine an apparent diffusion coefficient (ADC) in vivo for the sample disposed in the MRI phantom.

Figure 1:
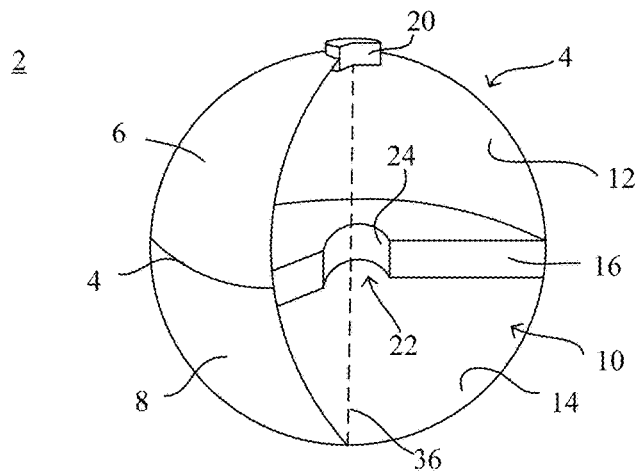
FIG. 1 shows a cutaway view of a magnetic resonance imaging (MRI) phantom.
Figure 2:
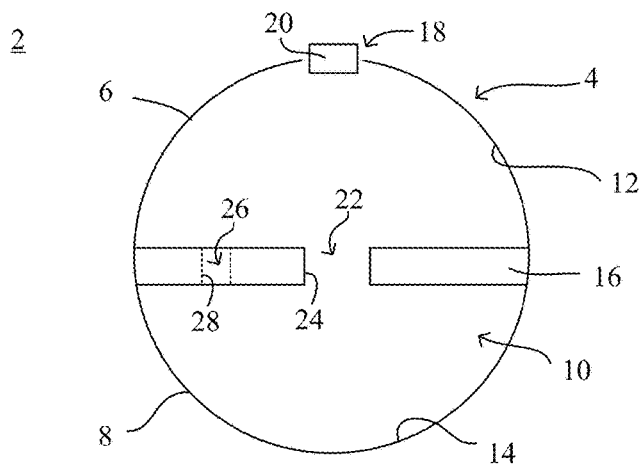
FIG. 2 shows a cross-section of the MRI phantom shown in FIG. 1.

In an embodiment, as shown in FIG. 1 (a cutaway perspective view) and FIG. 2 (a longitudinal cross-sectional view along indicator line 36), MRI phantom 2 includes sample holder 16 disposed in outer container 4. Outer container 4 includes first portion 6 disposed on second portion 8 and internal volume 10 bounded by first wall 12 of first portion 6 and second wall 14 of second portion 8. First portion 6 includes fill port 18 for disposal of a fluid (not shown) in internal volume 10. Cover member 20 is disposed on fill port 18 to seal MRI phantom 2. Cover member 20 can fit over fill port 18 or a portion of cover member 20 can be inserted into fill port 18. Attachment of cover member 20 to outer container 4 can be accomplished using a fastener (e.g., a screw, bolt, clamp, and the like) or through a compression fit occurring between cover member 20 and outer container 4. In a certain embodiment, second portion 8 includes a fill port 18 or cover member 20. It should be appreciated that, although shown, indicator line 36 is not part of MRI phantom 2 but is shown in FIG. 1 to provide a reference for the longitudinal cross-section view shown in FIG. 2.

Figure 3:
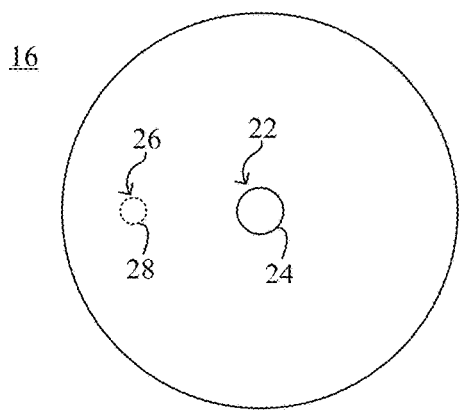
FIG. 3 shows a top view of the sample holder shown in FIG. 1.

With reference to FIGS. 1, 2, and 3 (a top view of sample holder 16), sample holder 16 includes sample receiver 22 that is bound by receiver wall 24. Accordingly, sample receiver 22 is configured to receive or retain a sampled disposed therein. As such, sample holder 16 maintains a sample in a position within outer container 4. In an embodiment, sample holder 16 is disposed fixedly to first portion 6, second portion 8, or a combination of the foregoing portions. In some embodiments, as shown in FIG. 3, sample holder 16 also includes flow member 26 that is bounded by fluid wall 28. Here, fluid disposed in outer container 4 is communicated between first portion 6 and second portion 8 through flow member 26. In this manner, fluid disposed in internal volume 10 can maintain a selected constant temperature over a selected time.

Figure 4:
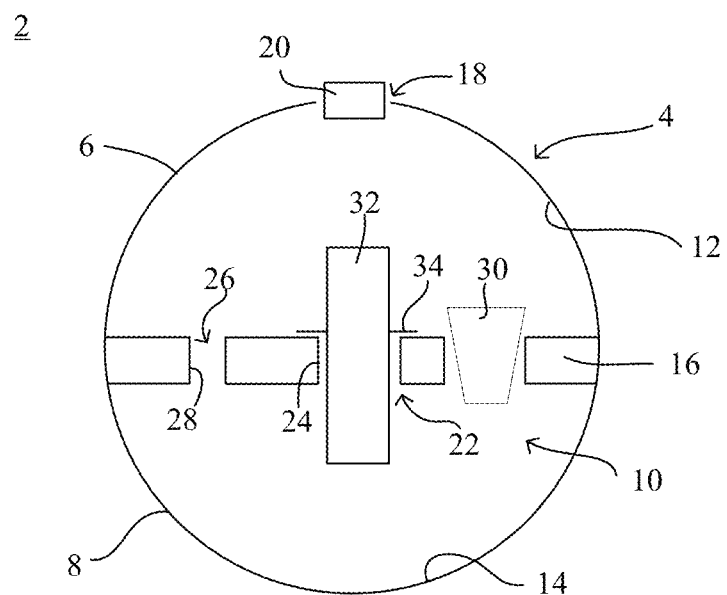
FIG. 4 shows a cross-section of an MRI phantom.
Figure 5:
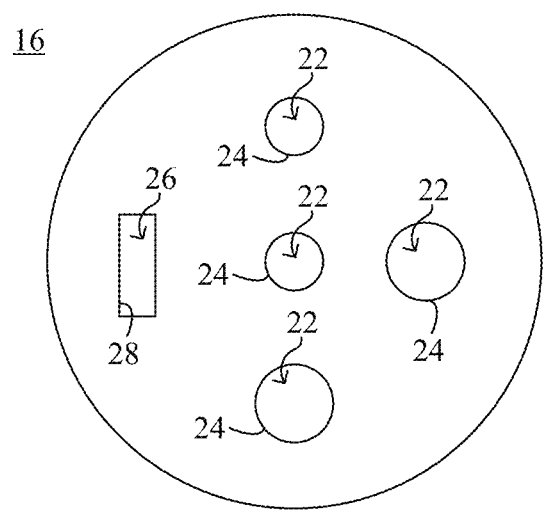
FIG. 5 shows a top view of the sample holder shown in FIG. 4.

According to an embodiment, as shown in FIG. 4 (longitudinal cross-section of MRI phantom 2) and FIG. 5 (top view of sample holder 16), sample holder 16 includes a plurality of sample receivers 22 to hold a plurality of sample members (32, 30). Sample members 30, 32 can have a shape to engage receiver wall 24 and to be disposed and engagingly retained in sample receivers 22. In this manner, sample members (30, 32) are maintained in a position disposed in interior volume 10 such that sample members (30, 32) do not float freely in the fluid that is also disposed in outer container 4. It should be appreciated that maintaining a constant position of sample members (30, 32) in MRI phantom 2 during imaging provides determination of a property of a content of sample members (30, 32) such as ADC. However, if sample members (30, 32) moved freely in interior volume 10, such property would be difficult to obtain from an acquired MRI image of sample members (30, 32).

The outer shape of sample members (30, 32) can include a tapered shape, conical shape, frustoconical shape, spherical shape, polygonal shape, and the like. Additionally, sample member 32 can include flange 34 to engage an upper surface of sample holder 16. Moreover, a shape of sample receiver 22 made by receiver wall 24 can be a same shape or different shape than the outer shape of sample members (30, 32) and can independently be a tapered shape, conical shape, frustoconical shape, spherical shape, polygonal shape, and the like.

Figure 6:
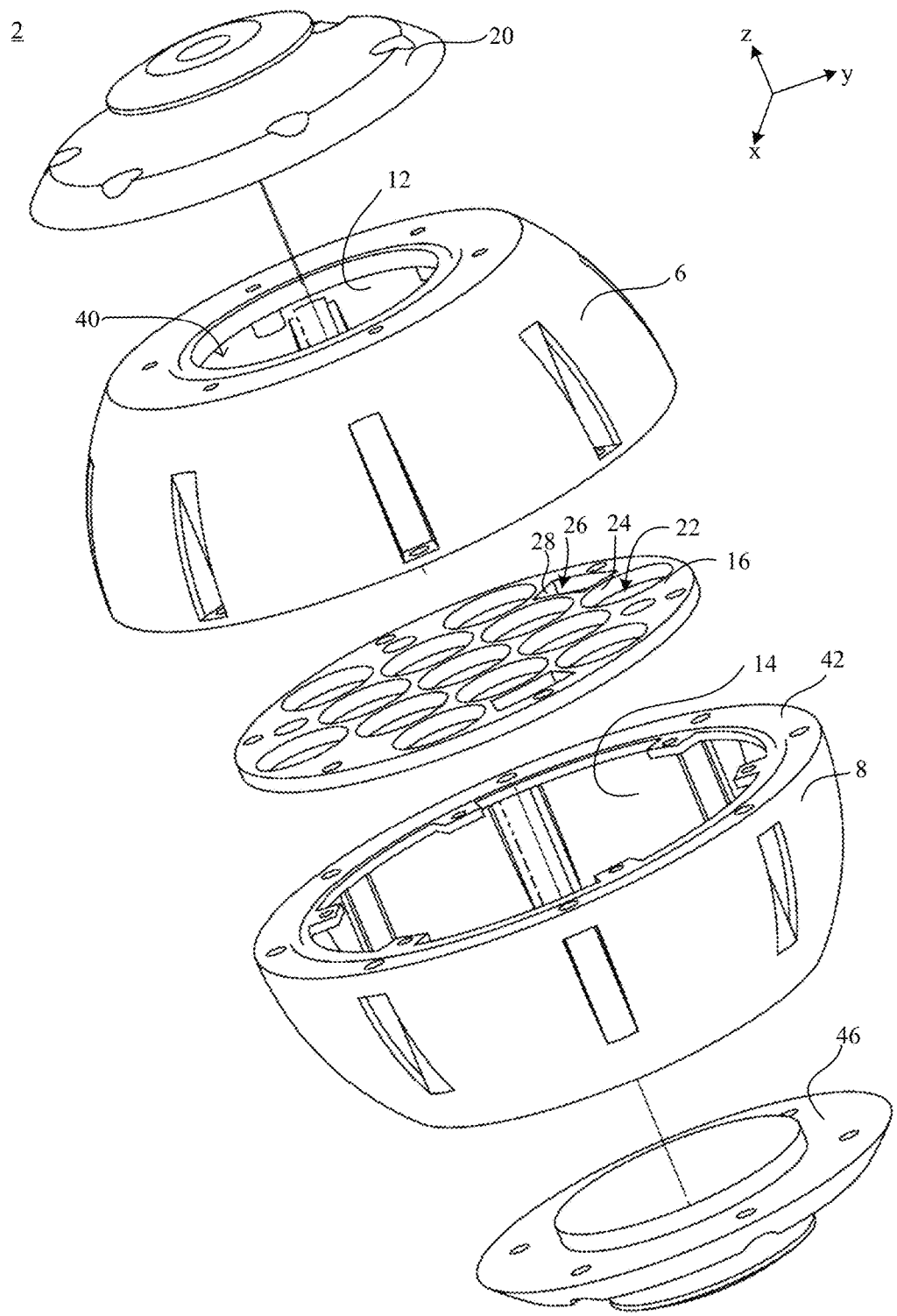
FIG. 6 shows an exploded view of an MRI phantom.
Figure 7:
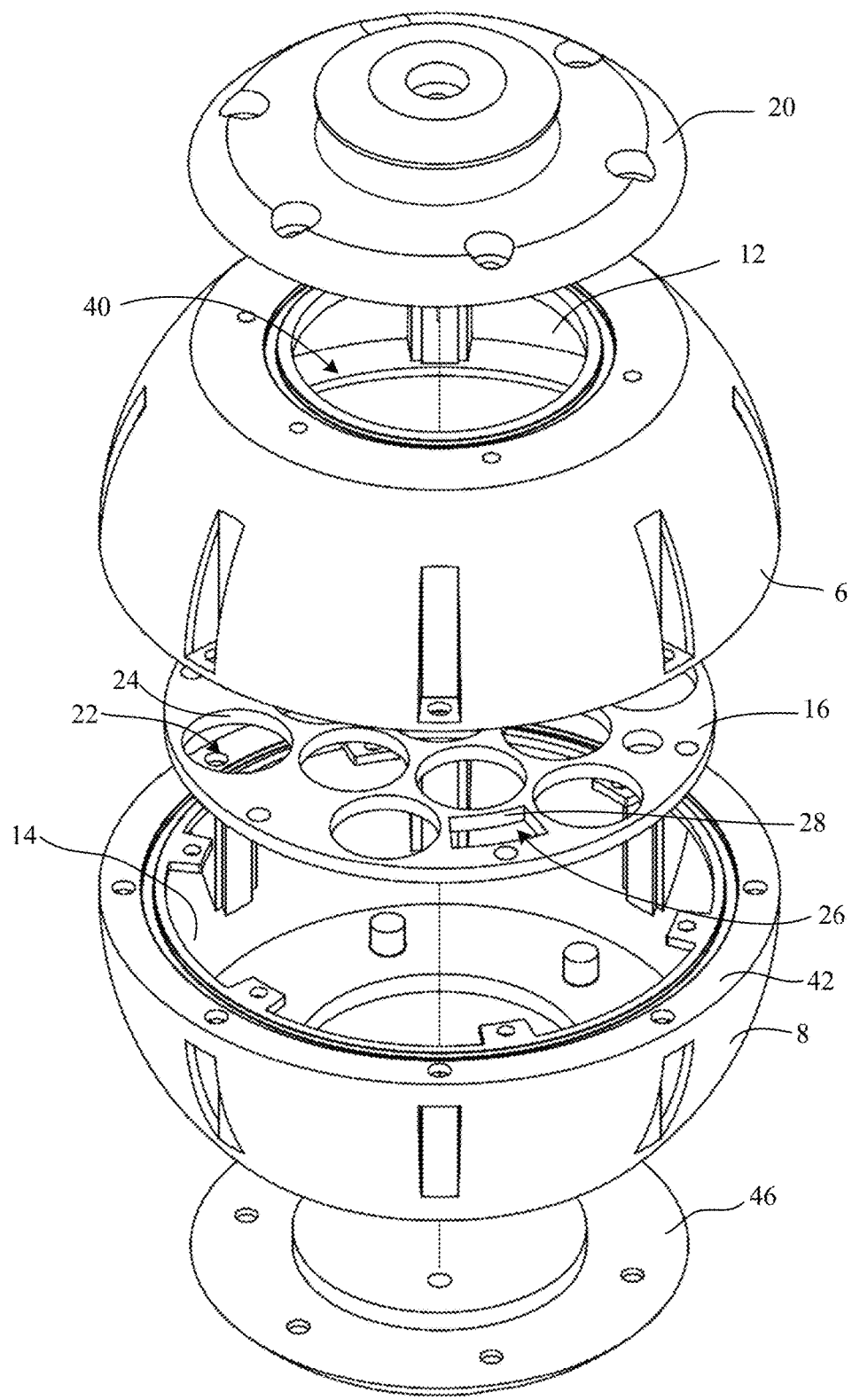
FIG. 7 shows an exploded view of the MRI phantom shown in FIG. 6.
Figure 8:
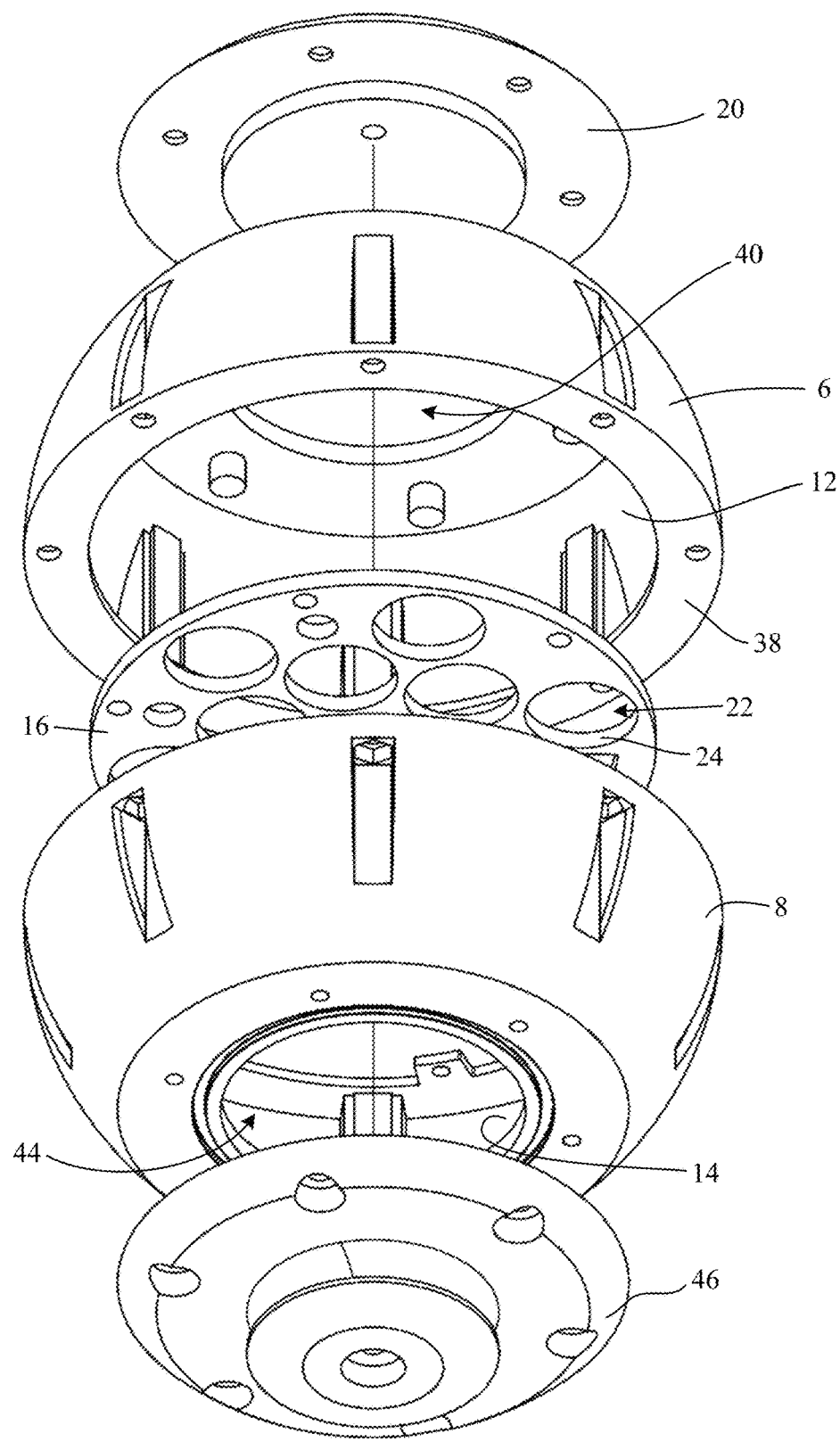
FIG. 8 shows an exploded view of the MRI phantom shown in FIG. 6.
Figure 9:
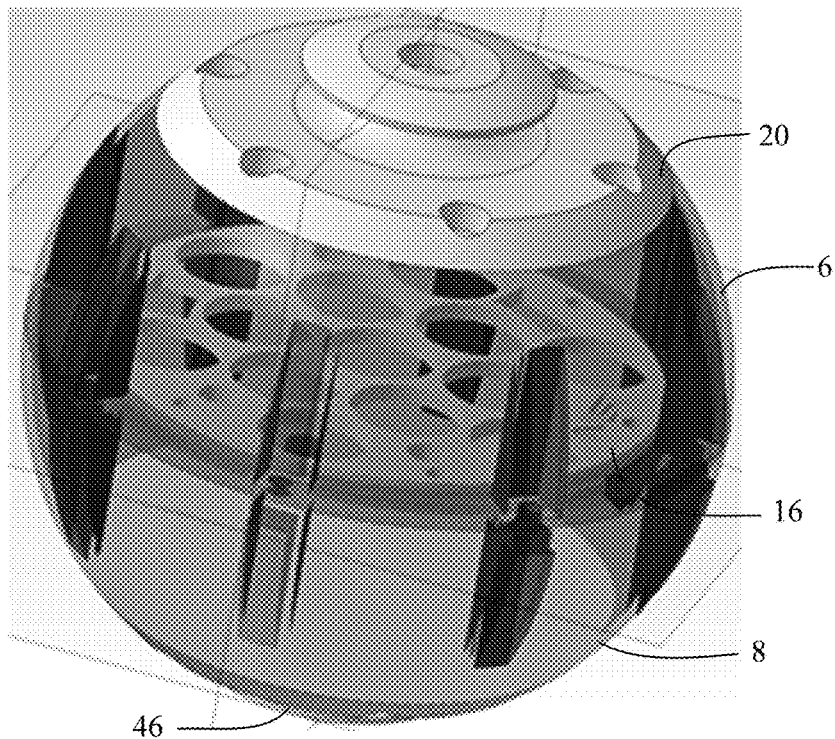
FIG. 9 shows a perspective view of the MRI phantom shown in FIG. 6.
Figure 10:
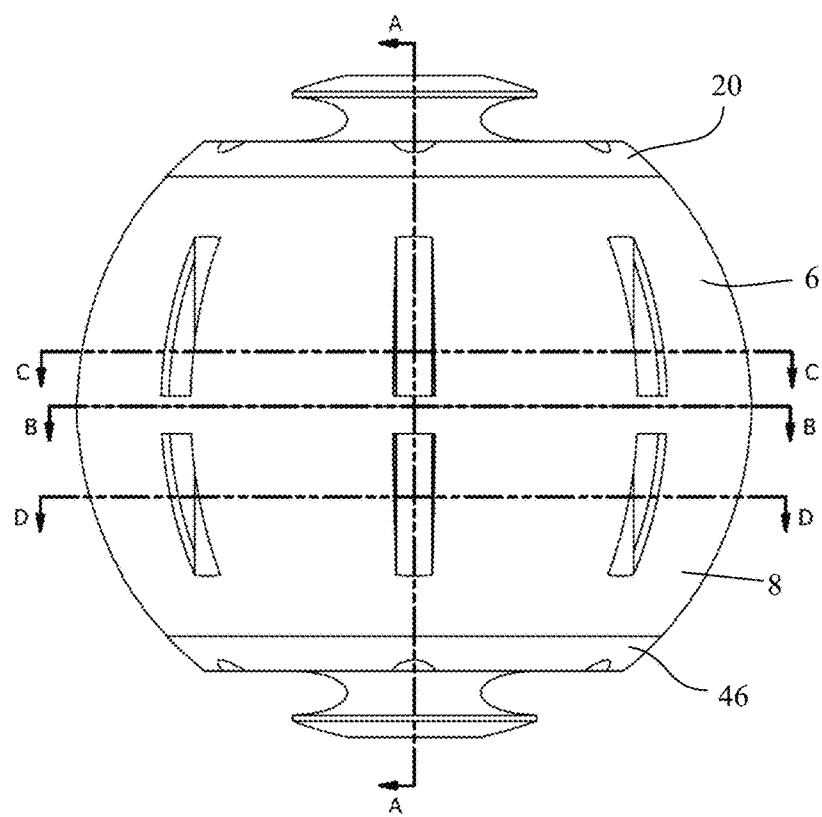
FIG. 10 shows a side view of the MRI phantom shown in FIG. 6.

In an embodiment, as shown in FIG. 6 (exploded perspective view), FIG. 7 (exploded perspective view from top), FIG. 8 (exploded perspective view from bottom), FIG. 9 (see-through perspective view), and FIG. 10 (side view), MRI phantom 2 includes outer container 4 and sample holder 16 to hold a sample member disposed in internal volume 10 of outer container 4. Outer container 4 includes first portion 6 that includes first wall 12; second portion 8 opposingly disposed to first portion 6 and sealingly engaged to first portion 6 and including second wall 14; and internal volume 10 bounded by first wall 12 and second wall 14, wherein internal volume 10 is hollow and configured to receive the fluid. Here, MRI phantom 2 is configured to maintain a constant temperature of internal volume 10, e.g., when disposed in an MRI machine. First portion 6 includes first sealing surface 38 (shown in FIG. 8) to form a seal in combination with second portion 8 and also includes first fill port 40 distal to first sealing surface 38. First cover member 20 is disposed on first portion 6 to cover first fill port 40. Second portion 8 includes second sealing surface 42 (shown in FIGS. 6 and 7) to form the seal in combination with first portion 6 and also includes second fill port 44 distal to second sealing surface 42. Second cover member 46 is disposed on second portion 8 to cover second fill port 44.

Cover members (20, 46) are disposed on first portion 6 or second portion 8 to seal MRI phantom 2. In some embodiments, first cover member 20 and second cover member 46 have dissimilar features. In an embodiment, first cover member 20 and second cover member 46 have identical features.

Figure 11:
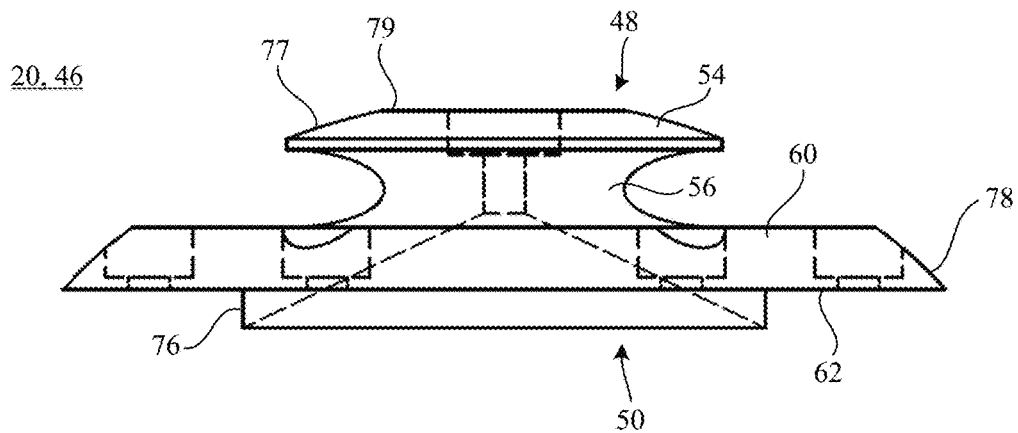
FIG. 11 shows a side view of a cover member.
Figure 12:
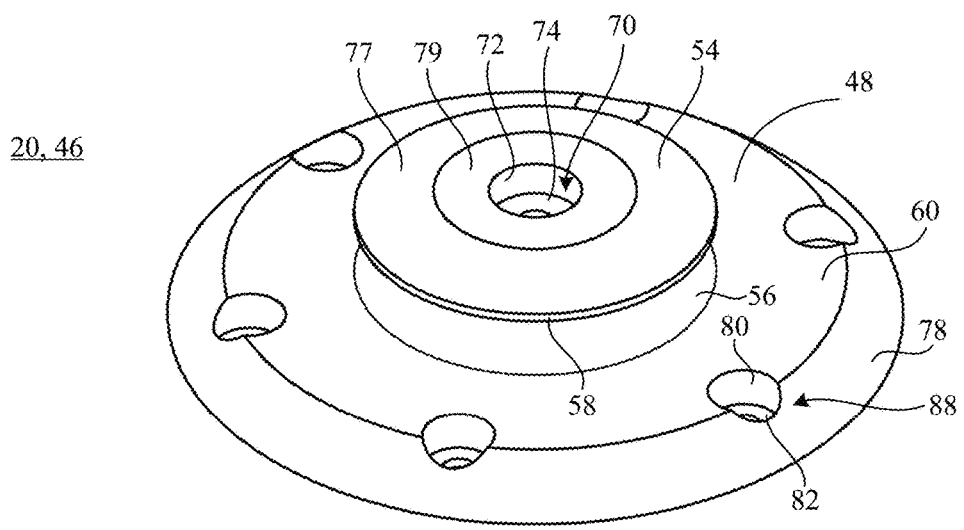
FIG. 12 shows a perspective view of the cover member shown in FIG. 11.
Figure 13:
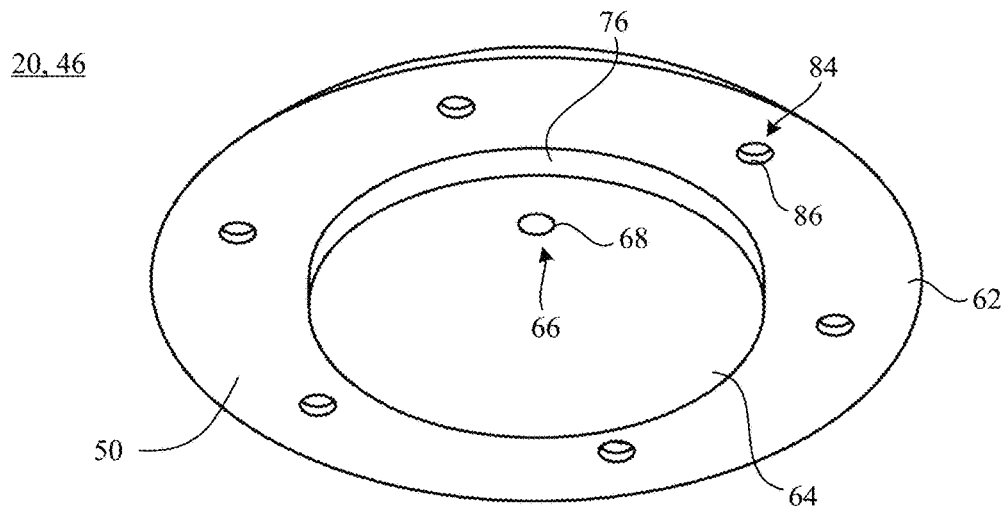
FIG. 13 shows a perspective view of the cover member shown in FIG. 11.
Figure 14:
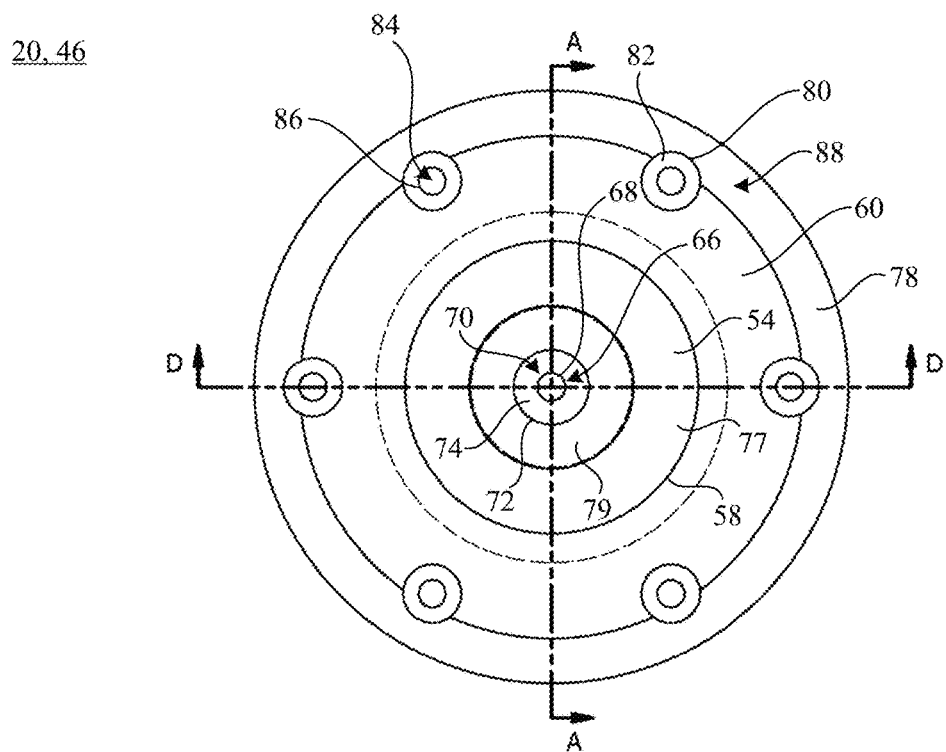
FIG. 14 shows a top view of the cover member shown in FIG. 11.
Figure 15:
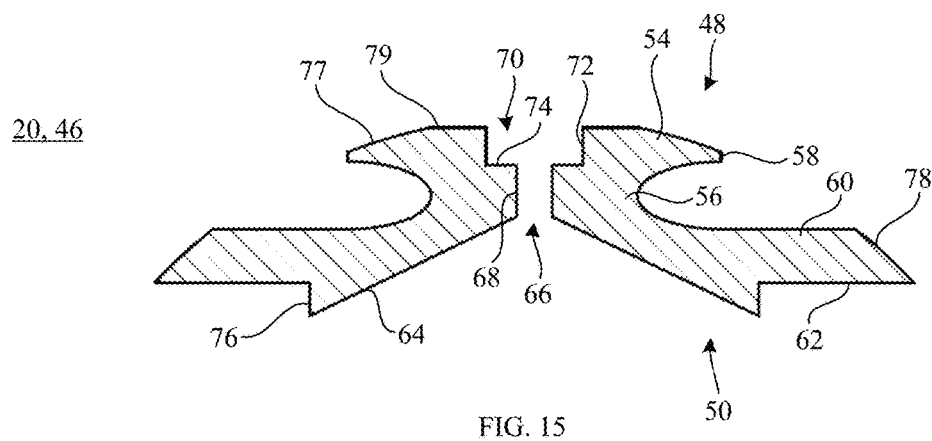
FIG. 15 shows a cross-section along line A-A of the cover member shown in FIG. 14.
Figure 16:
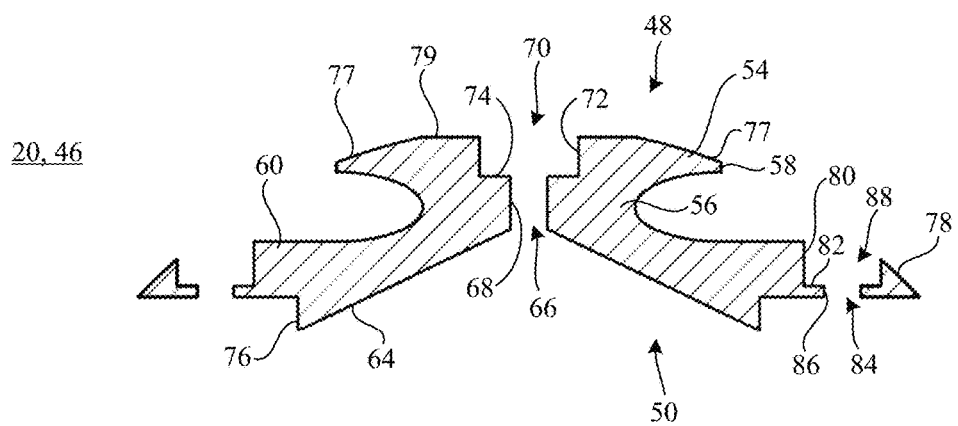
FIG. 16 shows a cross-section along line D-D of the cover member shown in FIG. 14.
Figure 17:
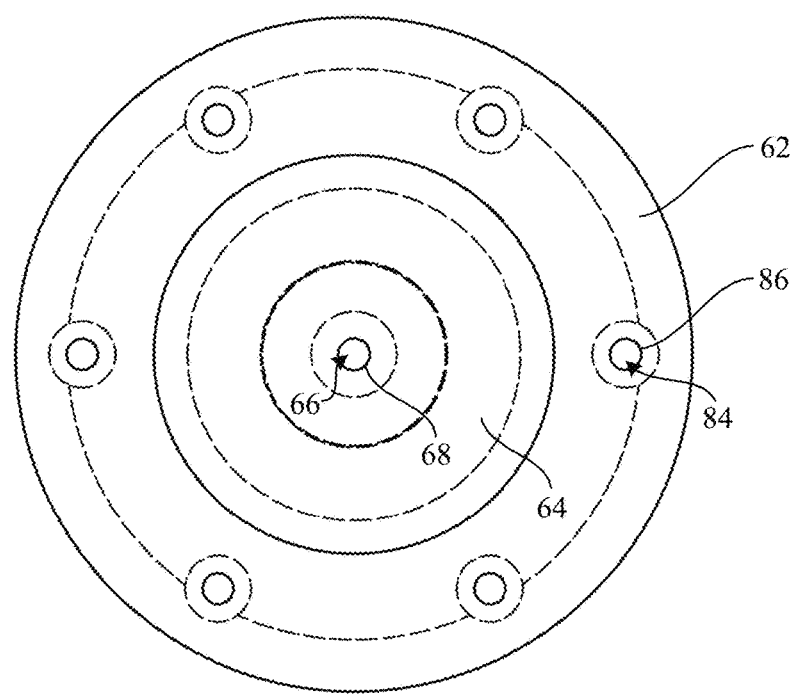
FIG. 17 shows a bottom view of the cover member shown in FIG. 14.

Cover members (40, 46) are shown in FIG. 11 (side view with dashed lines to indicate internal features), FIG. 12 (perspective view from top), FIG. 13 (perspective view from bottom), FIG. 14 (top view), FIG. 15 (cross-section along line A-A shown in FIG. 14), FIG. 16 (cross-section along line D-D shown in FIG. 14), and FIG. 17 (bottom view). Here, cover members (20, 46) include outer surface 48 and inner surface 50 with respect to internal volume 10 of MRI phantom 2. Handle 52 is disposed on outer surface 48 and includes knob 54, recess 56, and edge 58 interposed between knob 54 and recess 56 so that knob 54 and recess 56 have, e.g., a non-sharp transition between them. Recess 56 can have a shape (e.g., an elliptical shape) to provide a finger hold to remove cover members (20, 46) from first portion 6 or second portion 8.

Cover members (20, 46) also include flange 60, sealing surface 62, flow surface 64, and flow channel 66 bounded by wall 68. Flow surface 64 provides a contoured pathway to baffle fluid flow in internal volume 10 and to provide an unobstructed path for air bubbles to be communicated to flow channel 66 for expulsion from internal volume 10. Flow channel 66 extends from outer surface 48 to inner surface 50 to communicate the fluid therebetween. At outer surface 48, flow channel 66 terminates at recess 70 that is bounded by walls (72, 74). In some embodiments, a plug (not shown) can be inserted into recess 70 and flow channel 66 to engage walls (68, 72, 74) to seal flow channel 66. Flow channel 66 is configured to communicate the fluid between an external source of the fluid and internal volume 10.

Cover members (20, 46) also include protrusion 76 that extends from sealing surface 62 of outer surface 50 and engages a mating portion of first portion 6 or second portion 8 to seat cover member 20 on first portion 6 and to seat cover member 46 on second portion 8. Further, cover members (20, 46) also include surfaces (77, 78) to provide a shape that is consistent with a shape for first portion 6 and second portion 8 to provide MRI phantom 2 a selected shape such as spheroidal with a selected eccentricity. Additionally, surface 79 can be a flat surface so that MRI phantom 2 can be stably disposed on a flat surface (e.g., a table) with surface 79 in contact with the flat surface so MRI phantom 2 does not roll around on the flat surface.

Cover members (20, 46) also include recess 88 bounded by walls (80, 82) and through hole 84 bounded by wall 86. Through hole 84 and recess 88 are configured to receive and retain a fastener to fasten cover member 20 to first portion 6 and to fasten cover member 46 to second portion 8. Exemplary fasteners include a screw, bolt, rivet, dowel, and the like. According to an embodiment, recess 70 or flow channel 66 can be configured to receive a retain a fastener to seal cover member (20 or 46).

Flow surface 64 can have a conical shape whose angle relative to a horizontal axis of MRI Phantom 2 (e.g., corresponding to sample receiver 22) can be a selected angle such from 0° to 60°, specifically 5° to 45°, more specifically 10° to 30°, and further specifically 20° to 30°.

Figure 18:
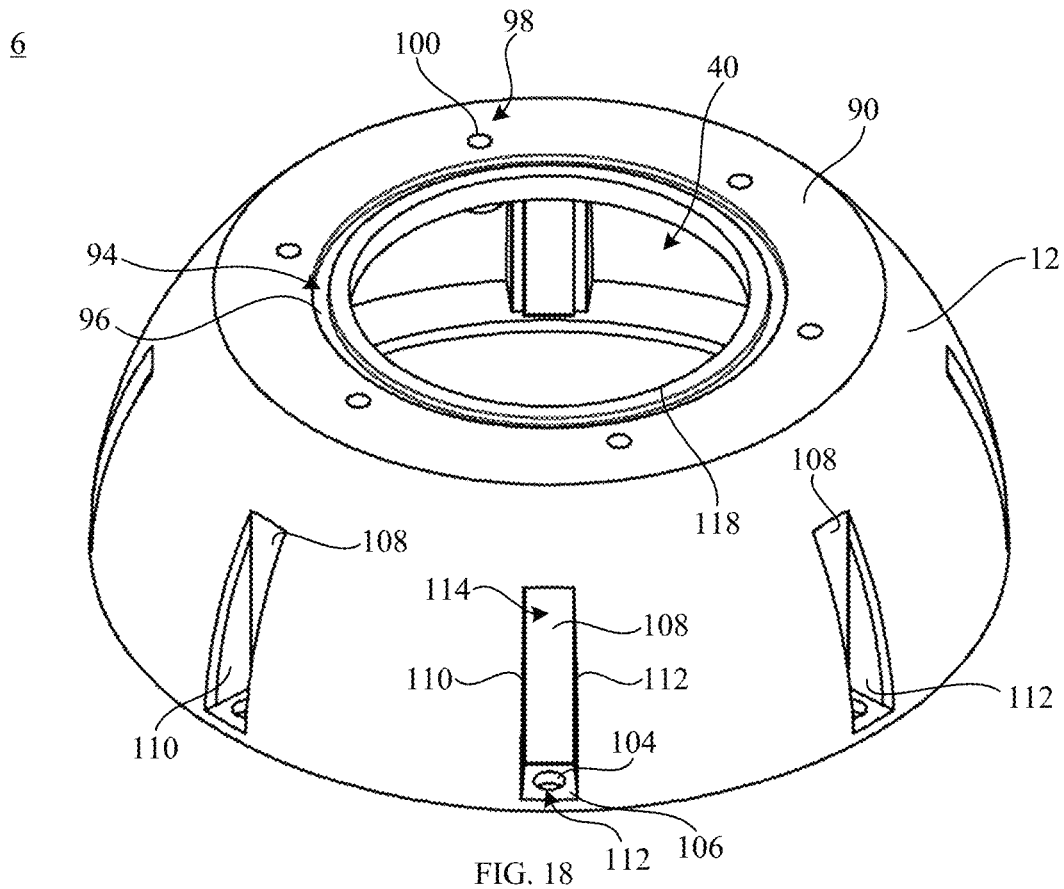
FIG. 18 shows a perspective view of a first portion.
Figure 19:
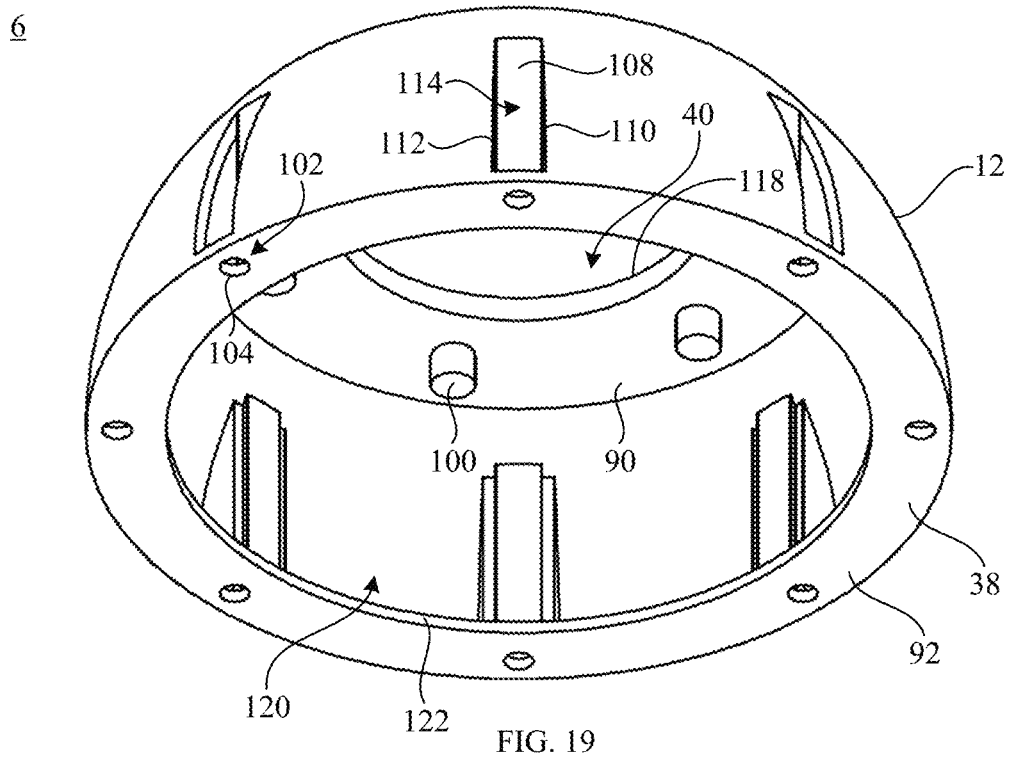
FIG. 19 shows a perspective view of the first portion shown in FIG. 18.
Figure 20:
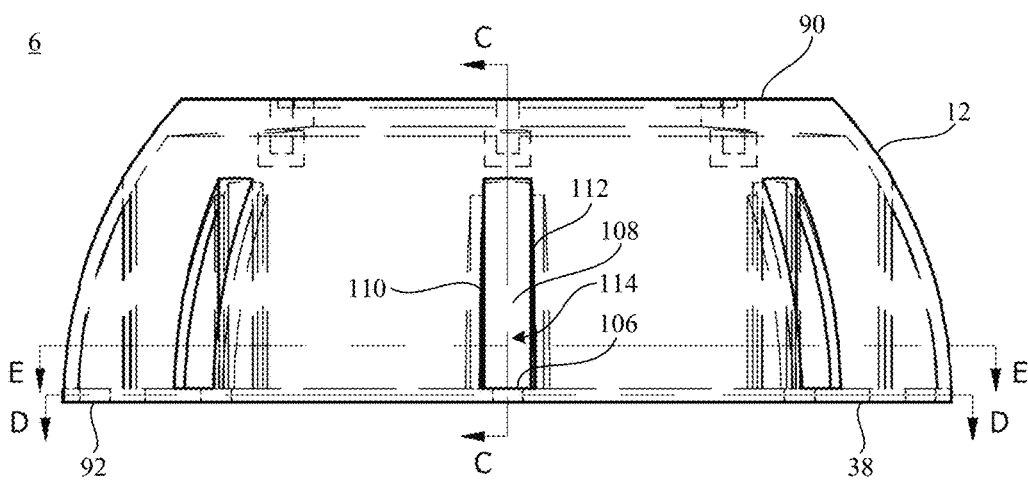
FIG. 20 shows a side view of the first portion shown in FIG. 18.
Figure 21:
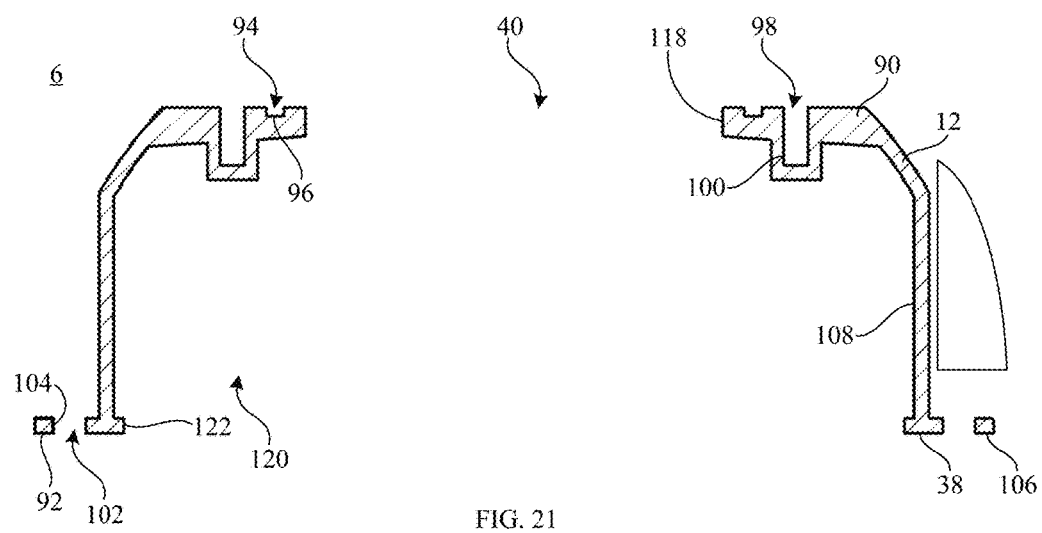
FIG. 21 shows a cross-section along line C-C of the first portion shown in FIG. 20.
Figure 22:
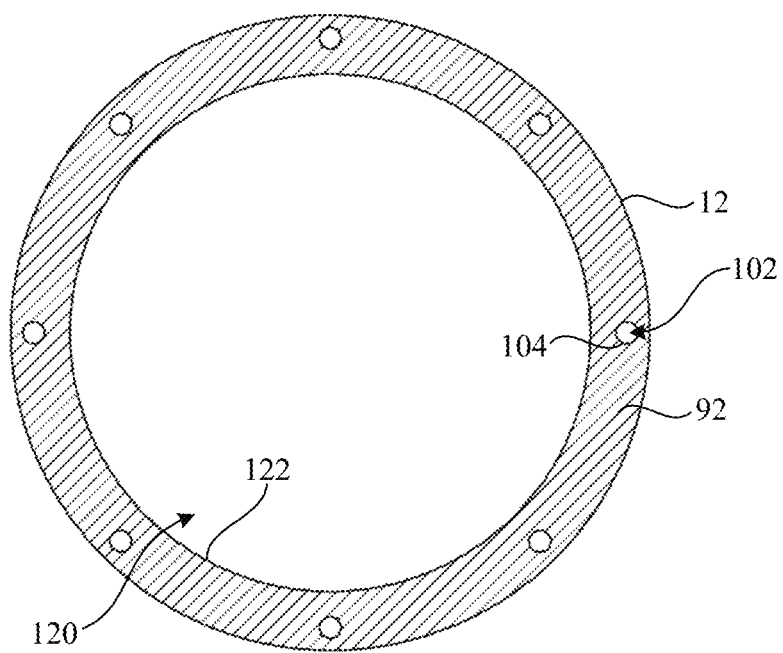
FIG. 22 shows a cross-section along line D-D of the first portion shown in FIG. 20.
Figure 23:
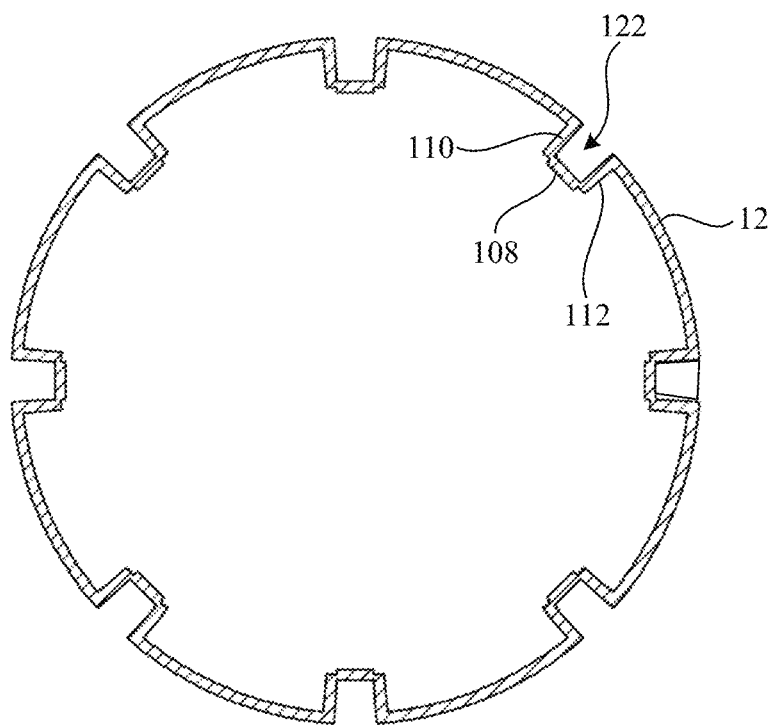
FIG. 23 shows a cross-section along line E-E of the first portion shown in FIG. 20.
Figure 24:
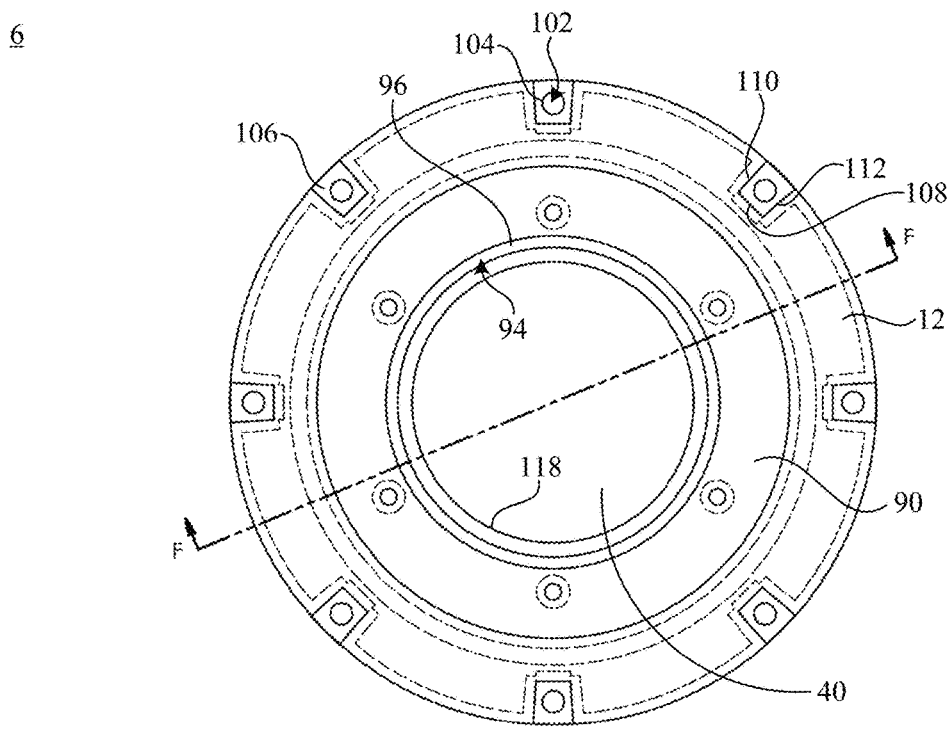
FIG. 24 shows a top view of the first portion shown in FIG. 18.
Figure 25:
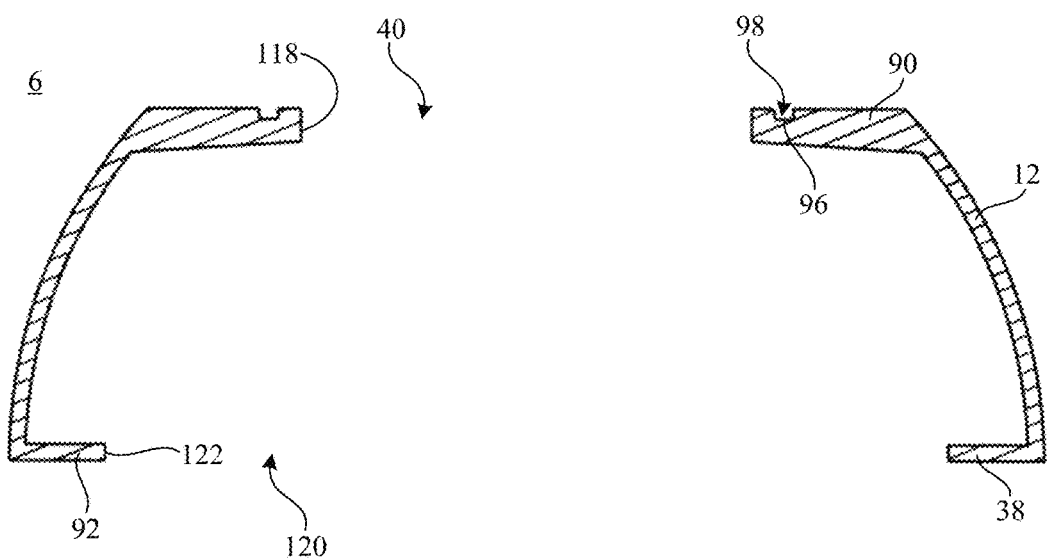
FIG. 25 shows a cross-section along line F-F of the first portion shown in FIG. 24.
Figure 26:
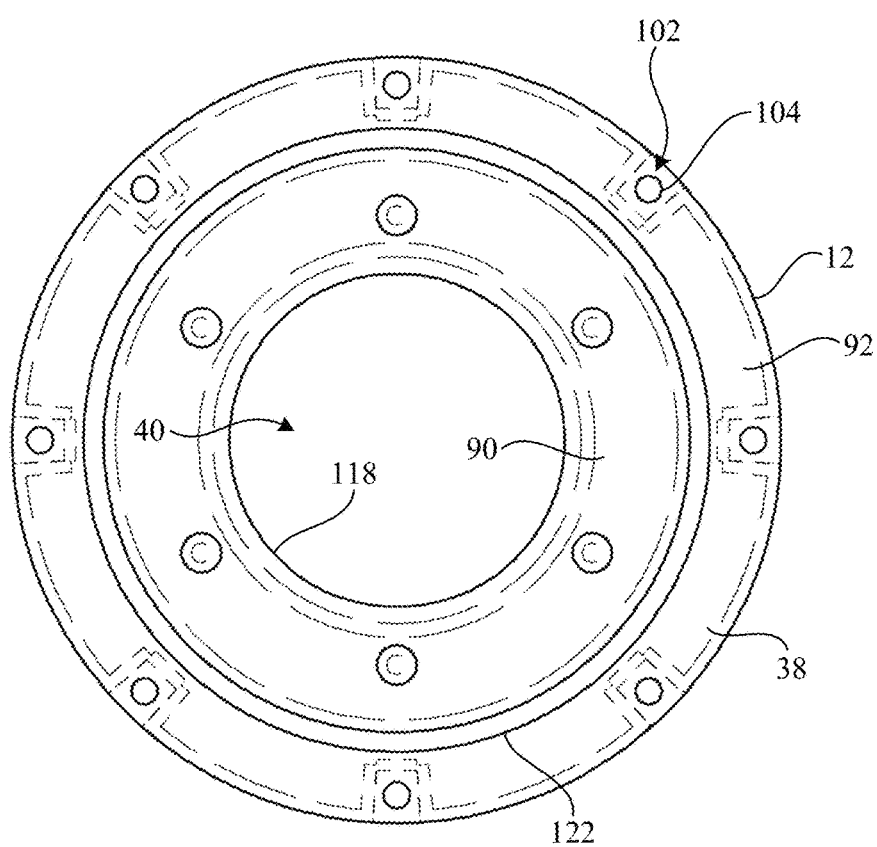
FIG. 26 shows a bottom view of the first portion shown in FIG. 18.

MRI Phantom 2 includes first portion 6. With reference to FIG. 18 (perspective view from top), FIG. 19 (perspective view from bottom), FIG. 20 (side view with dashed lines to indicate internal features), FIG. 21 (cross-section along line C-C shown in FIG. 20), FIG. 22 (cross-section along line D-D shown in FIG. 20), FIG. 23 (cross-section along line E-E shown in FIG. 20), FIG. 24 (top view), FIG. 25 (cross-section along line F-F shown in FIG. 24), and FIG. 26 (bottom view), first portion 6 includes first flange 90, second flange 92, and first wall 12 interposed between first flange 90 and second flange 92.

First flange 90 includes gland 94 bounded by gland wall 96 and configured to receive a sealing material (e.g., an elastomeric O-ring). The sealing material can be compressed between gland wall 96 and sealing surface 62 of first cover member 20 to create a seal between first cover member 20 and first portion 6. In this manner, first flange 90 can contact sealing surface 62 during compression of the sealing material. In a certain embodiment, the sealing material can be a gasket disposed between sealing surface 62 of first cover member 20 and first flange 90 of first portion 6 such that the gasket can be compressed between sealing surface 62 and first flange 90 to form a seal between first portion 6 and first cover member 20. Here, compression of the gasket can be accomplished in an absence of gland 94 or gland wall 96 or in presence of gland 94 but with or without disposition of a portion of the gasket in gland 94.

First flange 90 also includes recess 98 bounded by wall 100 and interposed between gland 94 and first wall 12. Here, recess 98 is configured to receive and retain the fastener disposed in through hole 84 of cover member 20. Wall 100 can include a thread to engage a mating thread of a fastener such as a screw or bolt. Recess 98 and wall 100 can align cover member 20 with first flange 90 by virtue of receiving a fastener such as a dowel in recess 98 and through hole 84. Additionally, first flange 90 includes first fill port 40 bounded by wall 118. It is contemplated that the fluid can be disposed in interior volume 10 by communicating the fluid from an external source of the fluid through first fill port 40.

Second flange 92 includes opening 120 bounded by wall 122. Additionally, second flange 92 includes a plurality of through holes 102 interposed between wall 122 and first wall 12 that is bounded by wall 104. Through holes 102 extend through second flange 92 and are configured to receive a fastener (e.g. a screw, bolt, dowel, and the like) to secure second flange 92 and first portion 6 to second portion 8. Surface 106 surrounds through hole 102 is disposed on an opposite side of second flange 92 from first sealing surface 38 and is configured, e.g., to engage a part of the fastener (e.g., a head of a screw).

Indent 114 extend along a length of first wall 12 and is bounded by walls (108, 110, 112) and terminates at surface 106 of second flange 92. In this manner, an outer diameter of second flange 92 is disposed within first wall 12 so that through holes 102 disposed in second flange 92 (or fasteners disposed therein) also do not extend radially beyond first wall 12.

Figure 52:
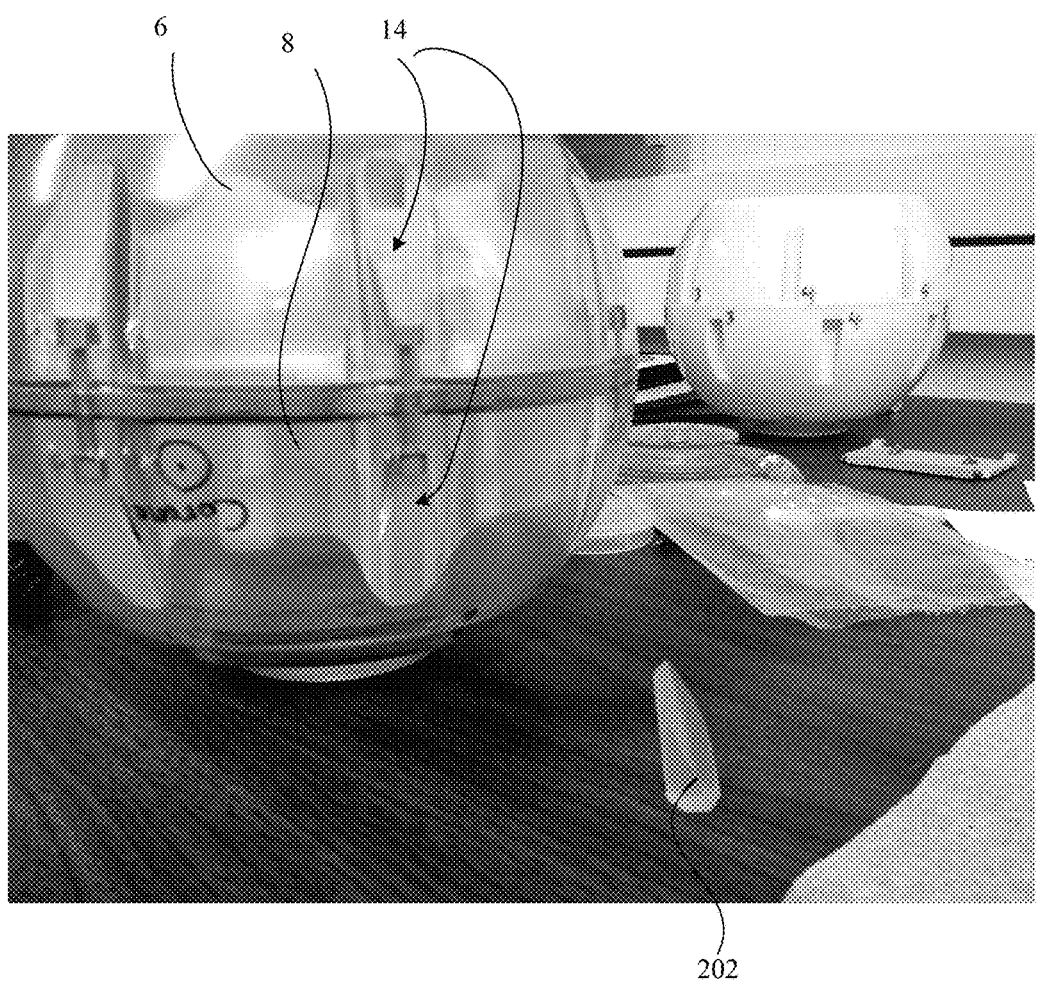
FIG. 52 shows a photograph of an MRI phantom and indent plug.

Indent plug 202 can be disposed in indent 114 (not shown in FIG. 18 but see FIG. 52). A shape and size of indent plug 202 fits snugly into indent 114 and sits proximate to and above the fastener to abutt walls 108, 110 and 112 such that an outer surface of indent plug 202 extends to a radius provided by surface 12. Indent plug 202 can include a material with a magnetic susceptibility similar to that of the fluid disposed in MRI phantom 2. It is contemplated that indent plug 202 reduces magnetic resonance imaging artifacts generated by a difference in magnetic susceptibility in adjacent, e.g., different, materials. It will be appreciated that a plurality of indent plugs 202 can be disposed in indents 114 such that indent plugs 202 are present in first portion 6 and second portion 8.

Figure 27:
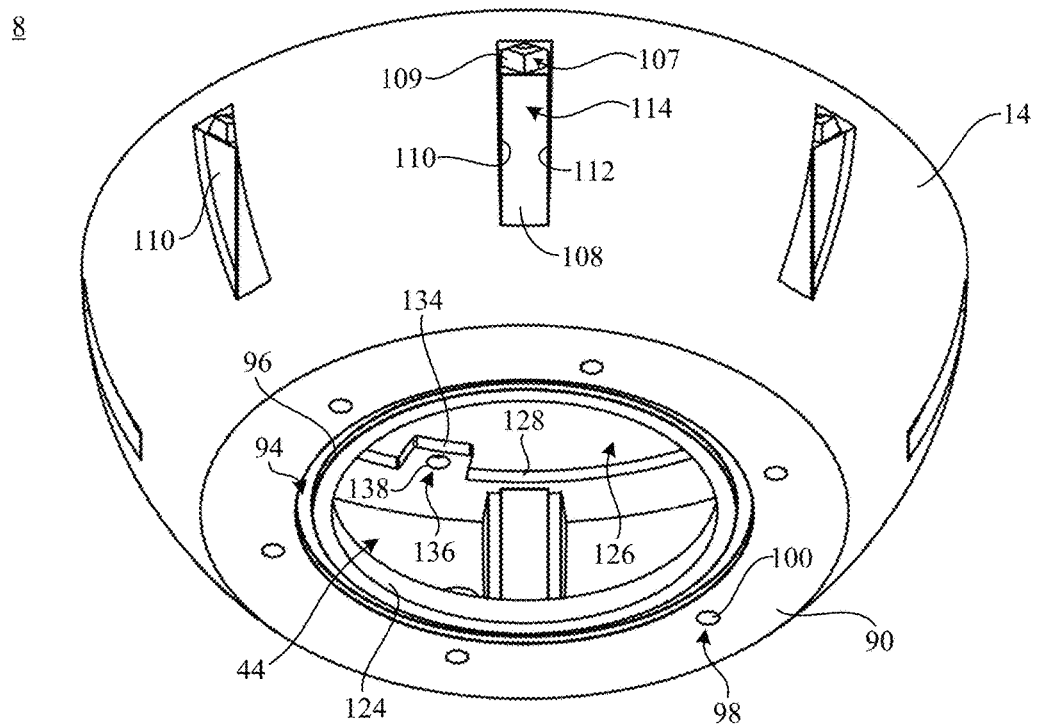
FIG. 27 shows a perspective view of a second portion.
Figure 28:
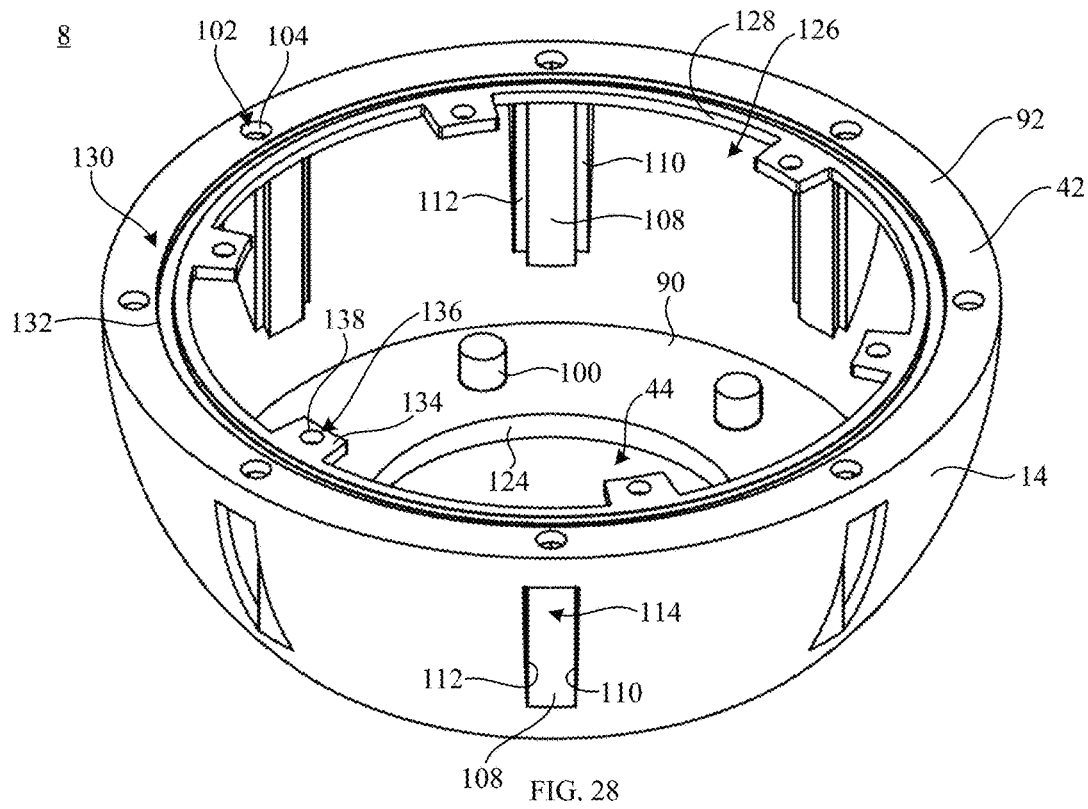
FIG. 28 shows a perspective view of the second portion shown in FIG. 27.
Figure 29:
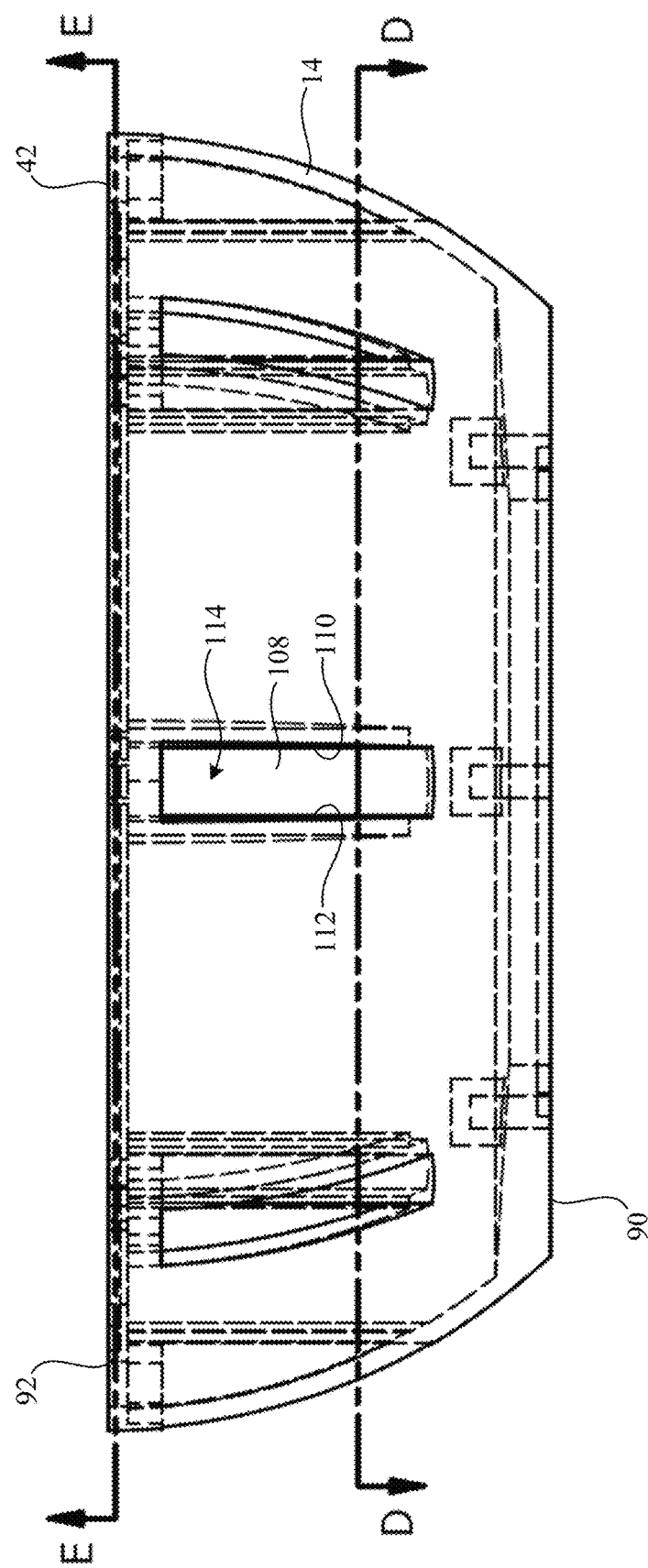
FIG. 29 shows a side view of the second portion shown in FIG. 27.
Figure 30:
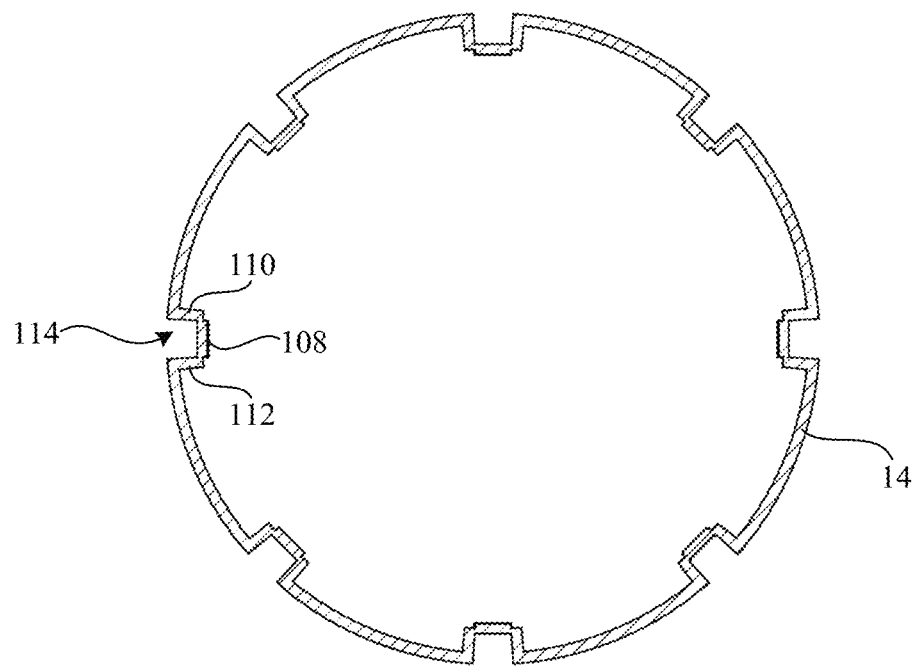
FIG. 30 shows a cross-section along line D-D of the second portion shown in FIG. 29.
Figure 31:
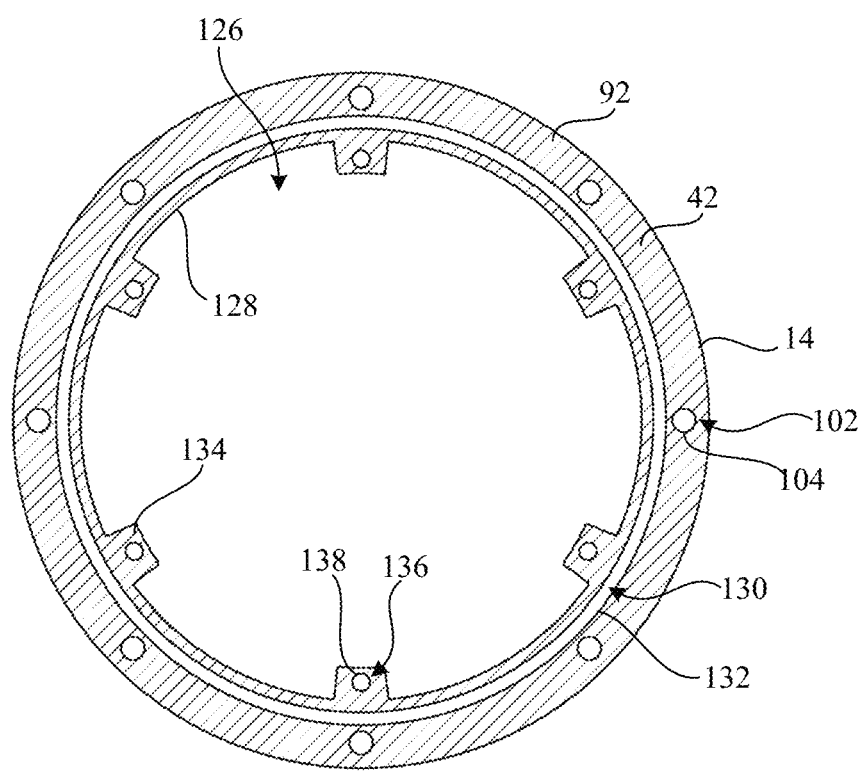
FIG. 31 shows a cross-section along line E-E of the second portion shown in FIG. 29.
Figure 32:
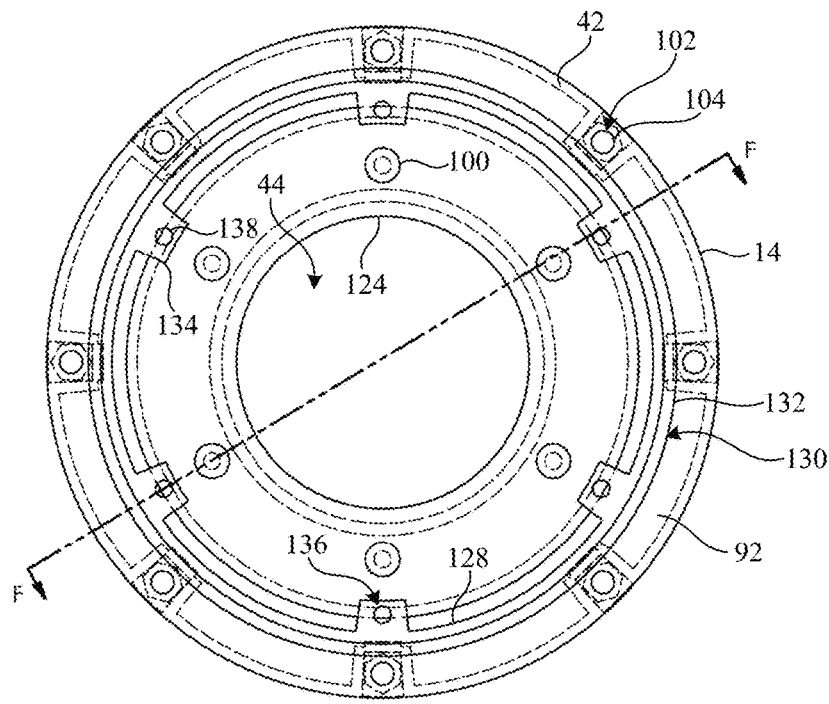
FIG. 32 shows a top view of the second portion shown in FIG. 27.
Figure 33:
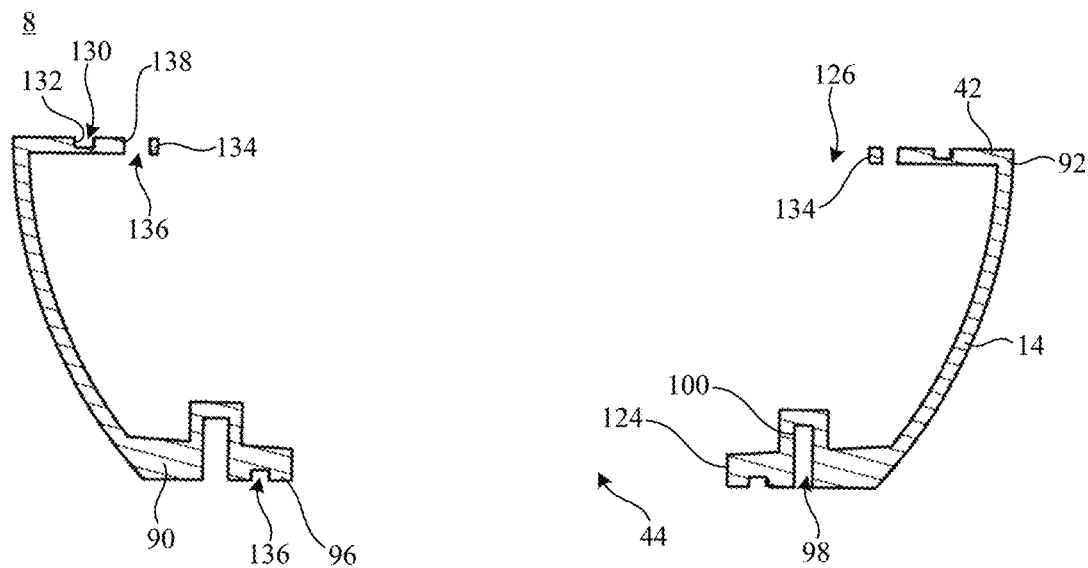
FIG. 33 shows a cross-section along line F-F of the second portion shown in FIG. 32.
Figure 34:
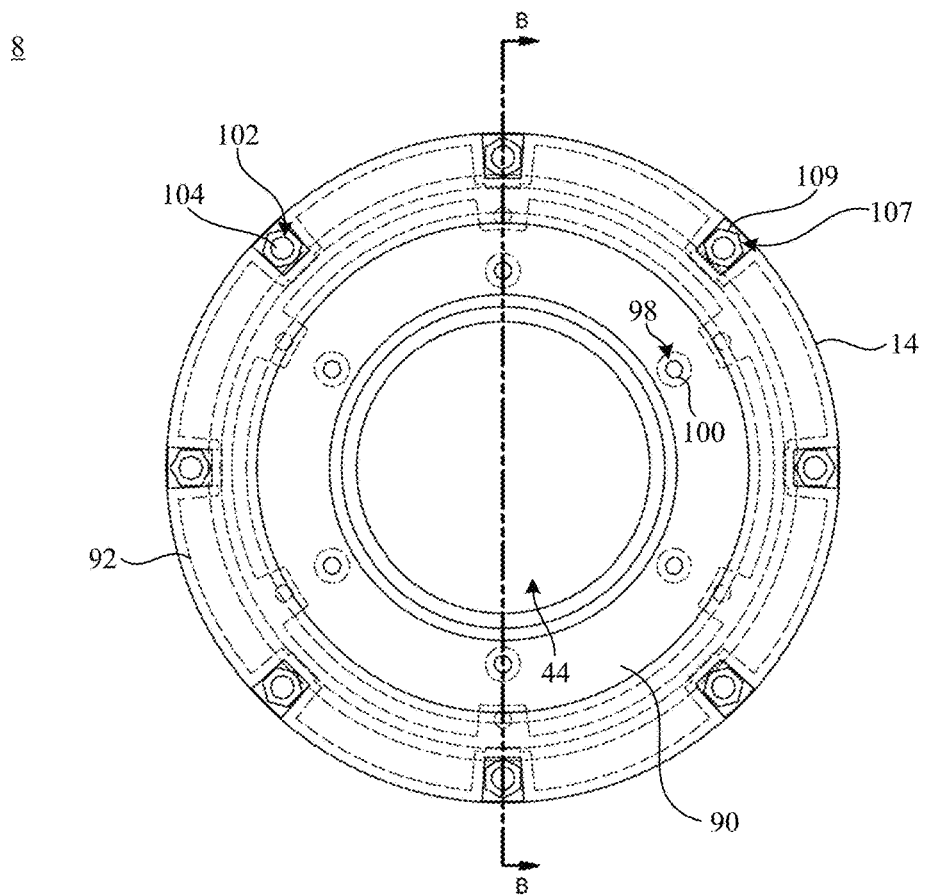
FIG. 34 shows a bottom view of the second portion shown in FIG. 27.
Figure 35:
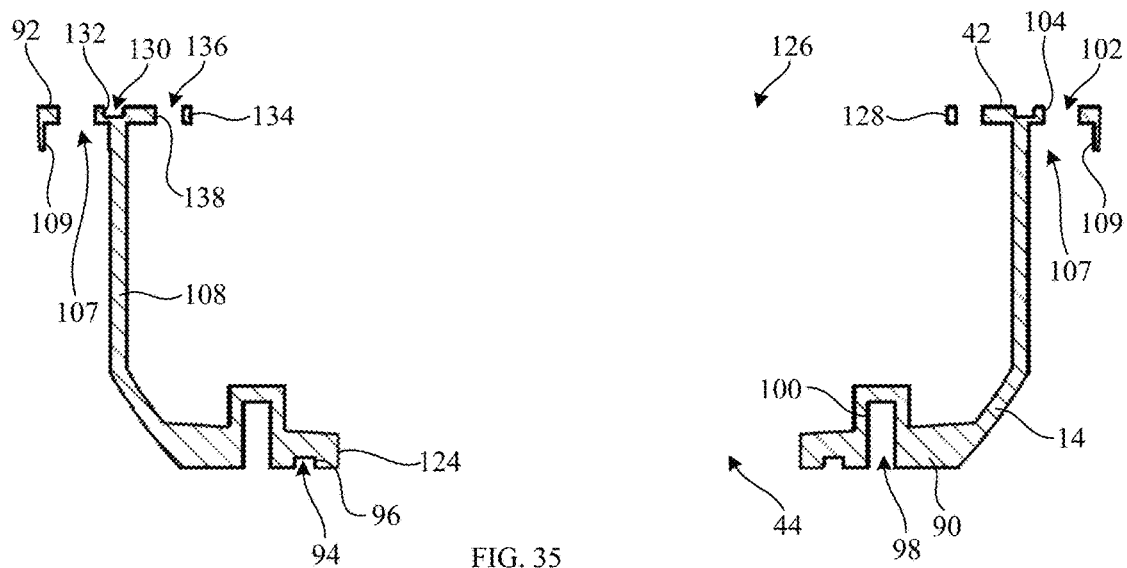
FIG. 35 shows a cross-section along line B-B of the second portion shown in FIG. 34.

MRI Phantom 2 further includes second portion 8 that, in an embodiment, interconnects with first portion 6. With reference to FIG. 27 (perspective view from bottom), FIG. 28 (perspective view from top), FIG. 29 (side view with dashed lines to indicate internal features), FIG. 30 (cross-section along line D-D shown in FIG. 29), FIG. 31 (cross-section along line E-E shown in FIG. 29), FIG. 32 (top view), FIG. 33 (cross-section along line F-F shown in FIG. 32), FIG. 34 (bottom view), and FIG. 35 (cross-section along line B-B shown in FIG. 34), second portion 8 includes first flange 90, second flange 92, and second wall 14 interposed between first flange 90 and second flange 92.

First flange 90 of second portion 8 includes gland 94 bounded by gland wall 96 and configured to receive a sealing material (e.g., an elastomeric O-ring). The sealing material can be compressed between gland wall 96 and sealing surface 62 of second cover member 46 to create a seal between second cover member 46 and second portion 8. In this manner, first flange 90 can contact sealing surface 62 during compression of the sealing material. In a certain embodiment, the sealing material can be a gasket disposed between sealing surface 62 of second cover member 46 and first flange 90 of second portion 8 such that the gasket can be compressed between sealing surface 62 and first flange 90 to form a seal between second portion 8 and second cover member 46. Here, compression of the gasket can be accomplished in an absence of gland 94 or in presence of gland 94 but with or without disposition of a portion of the gasket in gland 94.

First flange 90 of second portion 8 also includes recess 98 bounded by wall 100 and interposed between gland 94 and second wall 14. Here, recess 98 is configured to receive and retain the fastener disposed in through hole 84 of second cover member 46. Wall 100 can include a thread to engage a mating thread of a fastener such as a screw or bolt. Recess 98 and wall 100 can align second cover member 46 with first flange 90 by virtue of receiving a fastener such as a dowel in recess 98 and through hole 84. Additionally, first flange 90 includes second fill port 44 bounded by wall 124. It is contemplated that the fluid can be disposed in interior volume 10 by communicating the fluid from an external source of the fluid through second fill port 44.

Second flange 92 of second portion 8 includes opening 126 bounded by wall 128. Additionally, second flange 92 includes a plurality of through holes 102 interposed between wall 128 and second wall 14 that is bounded by wall 104. Through holes 102 extend through second flange 92 and are configured to receive a fastener (e.g. a screw, bolt, dowel, and the like) to secure second flange 92 and second portion 8 to first portion 6. Recess 107 (bounded by wall 109) surrounds through hole 102 and is disposed on an opposite side of second flange 92 from second sealing surface 42 and is configured, e.g., to engage a part of the fastener (e.g., a head of a screw or a nut). Recess 107 can have a shape such as polygonal, including square, hexagonal, and the like.

Additionally, second flange 92 of second portion 8 includes gland 130 bounded by gland wall 132. Gland 130 is configured to receive a sealing material (e.g., an elastomeric O-ring). The sealing material can be compressed between gland wall 96 and first sealing surface 38 of firs portion 6 (at second flange 92 of first portion 6) to create a seal between second portion 8 and first portion 6. In this manner, second flange 92 of second portion 8 can contact first sealing surface 38 of first portion 6 during compression of the sealing material. In a certain embodiment, the sealing material can be a gasket disposed between second sealing surface 42 of second portion 8 and first sealing surface 38 of first portion 6 such that the gasket can be compressed between second sealing surface 42 and first sealing surface 28. Here, compression of the gasket can be accomplished in an absence of gland 94 or in presence of gland 94 but with or without disposition of a portion of the gasket in gland 94.

Besides gland 132, second portion 8 includes a plurality of tabs 134 that extend from wall 128 and include hole 136 to attach sample holder 16 thereto, e.g., by using a fastener. Hole 136 is bounded by wall 138 and can be a through hole, blind hole, or a tapped hole that includes a thread to engage a screw or bolt.

Second portion 8 also includes indent 114 that extends along a length of second wall 14, is bounded by walls (108, 110, 112), and terminates at wall 109 of second flange 92. In this manner, an outer diameter of second flange 92 is disposed within second wall 14 so that through holes 102 disposed in second flange 92 (or fasteners disposed therein) also do not extend radially beyond second wall 14.

Figure 36:
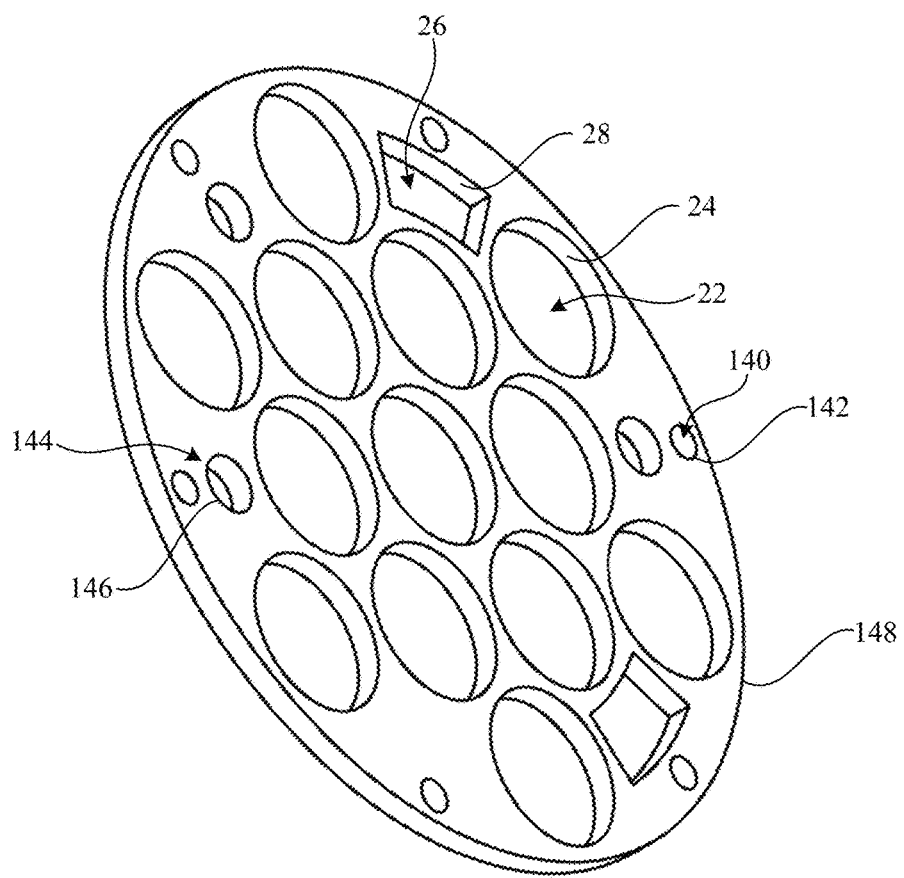
FIG. 36 shows a perspective view of a sample holder.
Figure 37:
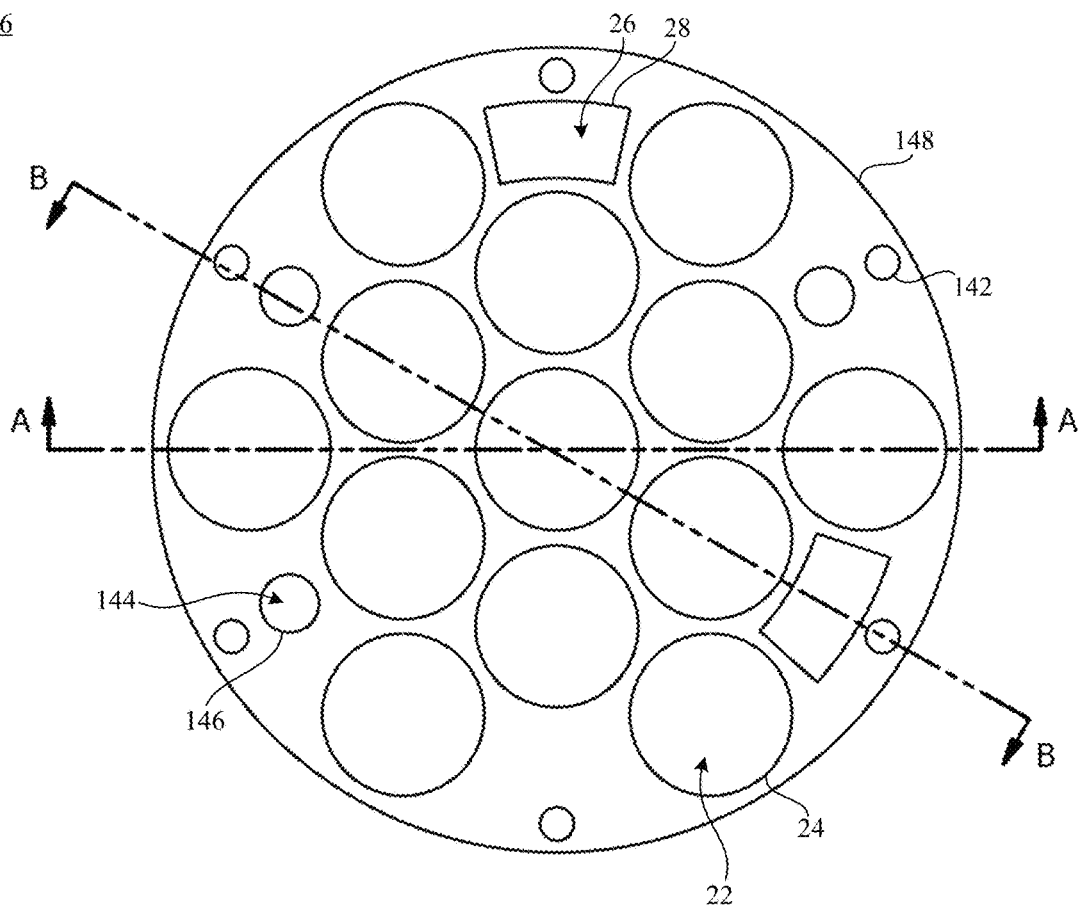
FIG. 37 shows a top view of the sample holder shown in FIG. 36.
Figure 38:
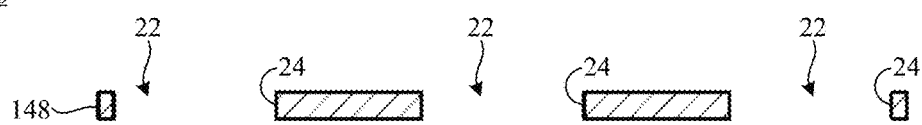
FIG. 38 shows a cross-section along line A-A of the sample holder shown in FIG. 37.
Figure 39:
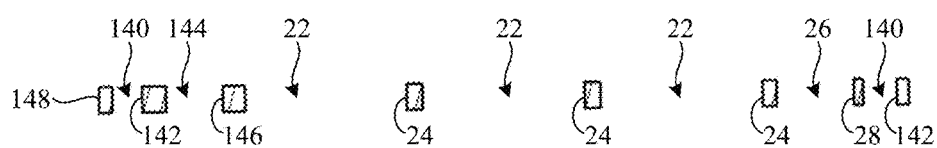
FIG. 39 shows a cross-section along line B-B of the sample holder shown in FIG. 37.

In MRI phantom 2, sample holder 16 is disposed in internal volume 10. With reference to FIG. 36 (perspective view), FIG. 37 (top view), FIG. 38 (cross-section along line A-A shown in FIG. 37) and FIG. 39 (cross-section along line B-B shown in FIG. 37), sample holder 16 includes sample receiver 22 bounded by receiver wall 24, flow member 26 bounded by fluid wall 28, hole 140 bounded by wall 142, and secondary hole 144 bounded by wall 146 and disposed within outer diameter 148. Sample receiver 22 is configured to receive a sample member. Further, hole 140 is provided to attach sample holder 16 to second portion 8, wherein hole 40 is configured to receive a fastener that is also disposed in hole 136 of tab 134 of second flange 92 of second portion 8. Further, hole 140 can be used to spatially align sample holder 16 to second portion 8 inside MRI phantom 2.

In MRI phantom 2, a fluid-permeable partition can be introduced to isolate particulates (e.g., ice cubes) from sample members held by sample holder 16. This partition can be attached either to the sample members, or fastened directly into sample holder 16. It is contemplated that this partition will reduce imaging artifacts potentially introduced by particulate matter.

According to an embodiment, sample holder 16 includes a plurality of sample receivers 22. In an embodiment, sample receivers 22 are arranged in a concentric ring around a center of sample holder 16 and surrounding sample receiver 22 located at the center of sample holder 16. Sample receiver 22 can be arranged in a selected pattern such as a hexagonal close-packed pattern. Secondary hole 144 can have a different diameter than sample receiver 22 and can be configured to receive a sample member that has a smaller size than that received by sample receiver 22. It is contemplated that the smaller size sample member can be a fiducial marker, wherein an orientation of MRI phantom 2 is determined from an MRI image that includes the fiducial marker.

Flow member 26 provides fluid communication between first portion 6 and second portion 8. Accordingly, a thermal equilibrium of first portion 6 and second portion 8 is produced due to communication of the fluid through flow member 26.

Figure 40:
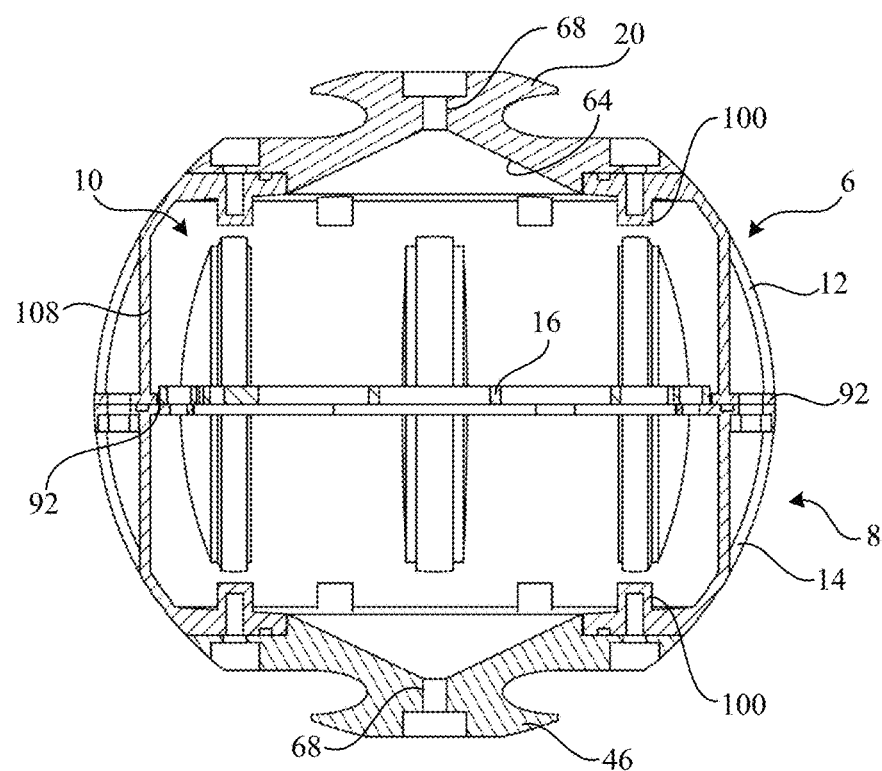
FIG. 40 shows a cutaway view along line A-A of the MRI phantom shown in FIG. 10.
Figure 41:
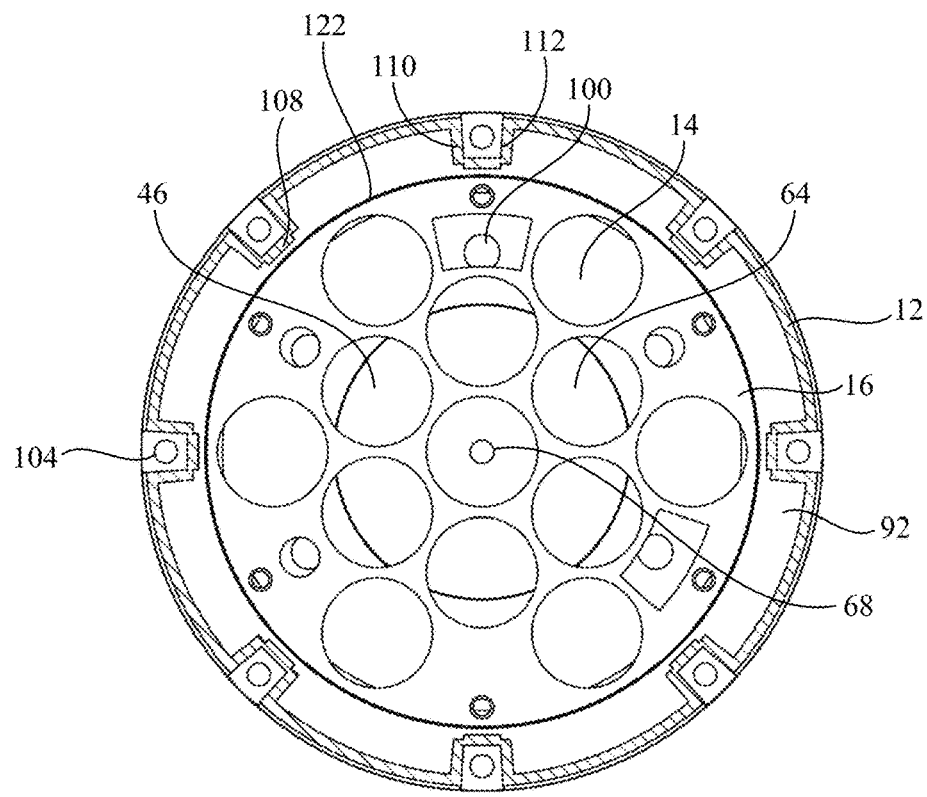
FIG. 41 shows a cutaway view along line C-C of the MRI phantom shown in FIG. 10.
Figure 42:
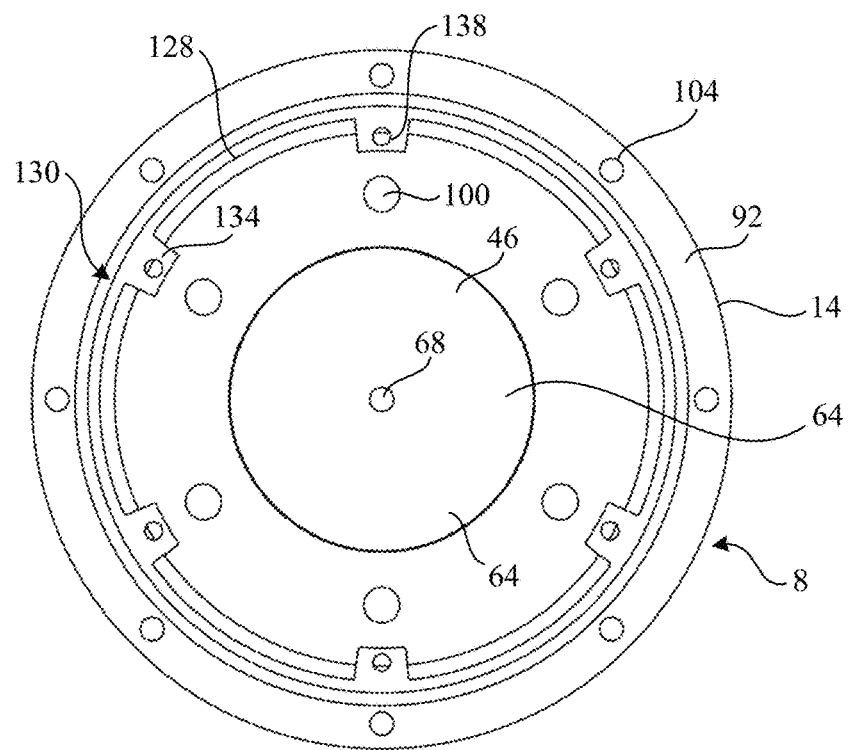
FIG. 42 shows a cutaway view along line B-B of the MRI phantom shown in FIG. 10.
Figure 43:
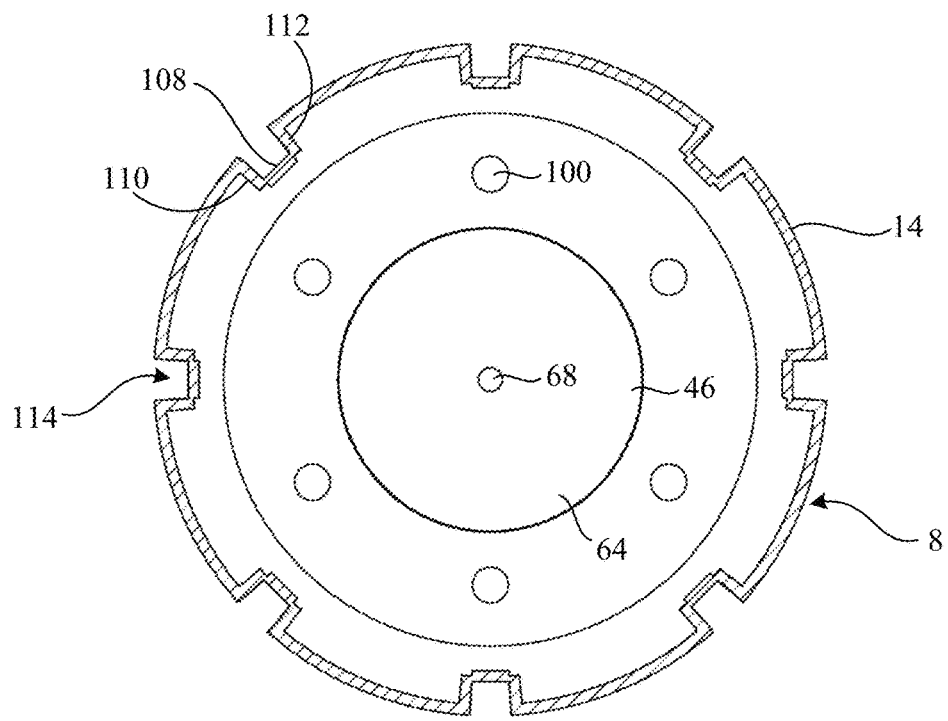
FIG. 43 shows a cutaway view along line D-D of the MRI phantom shown in FIG. 10.

Several cutaway views of MRI phantom 2 are shown in FIG. 40 (cutaway view of MRI phantom 2 along line A-A shown in FIG. 10), FIG. 41 (cutaway view of MRI phantom 2 along line C-C shown in FIG. 10), FIG. 42 (cutaway view of MRI phantom 2 along line B-B shown in FIG. 10), and FIG. 43 (cutaway view of MRI phantom 2 along line D-D shown in FIG. 10).

Figure 44:
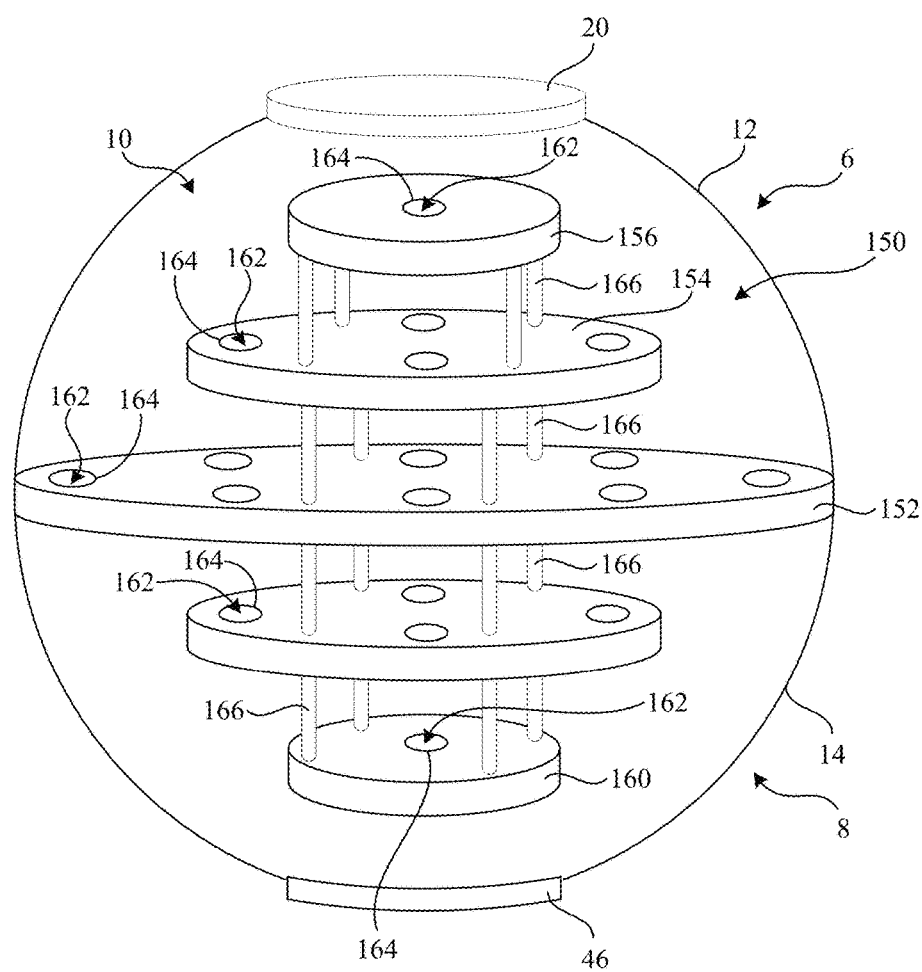
FIG. 44 shows a perspective view of an MRI phantom.
Figure 45:
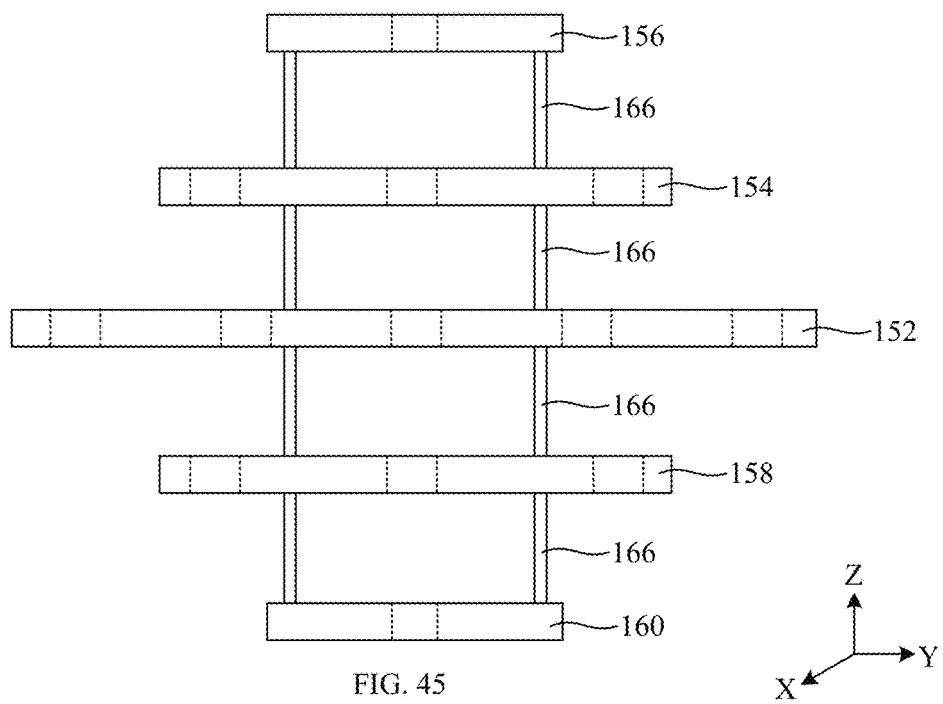
FIG. 45 shows a side view of the sample holder shown in FIG. 44.
Figure 46:
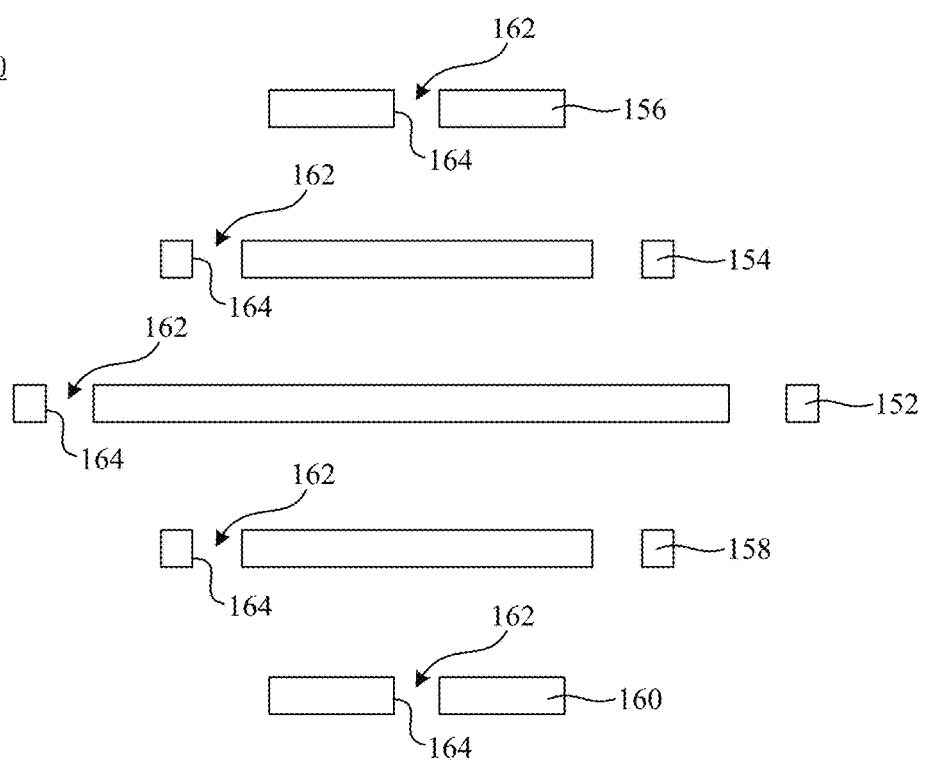
FIG. 46 shows a cross-section of the sample holder shown in FIG. 44.

In an embodiment, MRI phantom 2, as shown in a perspective in FIG. 44, includes sample holder 150 disposed in internal volume 10 formed by first wall 12 of the first portion 6 and second wall 14 of second portion 8. Sample holder 150 includes a plurality of platforms (152, 154, 156, 158, 160) that are stacked and spaced apart by spacer 166. Platforms (152, 154, 156, 158, 160) include sample receiver 162 bounded by wall 164 that is configured to receive a sample member. FIG. 45 and FIG. 46 respectively show a side view of sample holder 16 and a cross-section of sample holder 16 in a y-z plane shown in FIG. 45.

Figure 47:
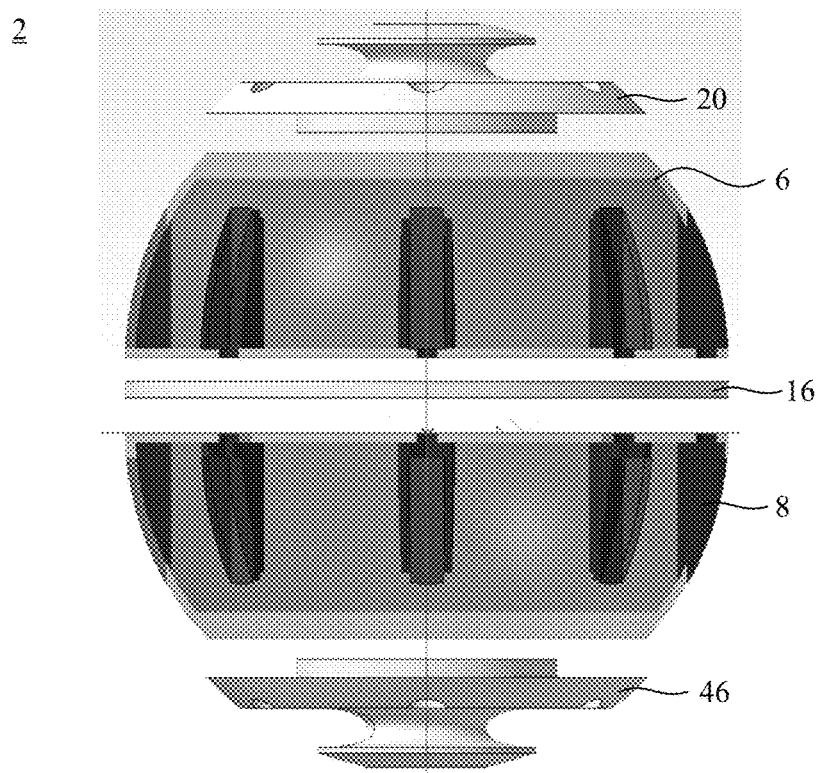
FIG. 47 shows an exploded view of an MRI phantom.

In an embodiment, as shown in FIG. 47 (which is an exploded view of MRI phantom 2), MRI phantom 2 includes sample holder 16 interposed between first portion 6 and second portion 8. Here, diameter 148 (see, e.g., FIG. 36) of sample holder 16 is similar to an outer diameter of first portion 6 and second portion 8. According to an embodiment, holes 140 (see, e.g., FIG. 36) are present in sample holder 16, and a fastener disposed through hole 102 in first portion 6 traverses hole 140 in sample holder 16 and also hole 102 in second portion 8 to attach first portion 6 and sample holder 16 to second portion 8. In some embodiments, holes 140 (see, e.g., FIG. 36) are absent in sample holder 16, and sample holder 16 is interposed between first portion 6 and second portion 8, wherein sample holder 16 is held in place by a fastener that engages first portion 6 and second portion 8 to apply pressure between sample holder 16, first portion 6, and second portion 8. In this configuration, sample holder 16 is sold to first portion 6 and second portion 8 with an elastomeric material such as a pair of gaskets or O-rings that are respectively disposed on opposite sides of sample holder 16.

MRI phantom 2 includes first portion 6, second portion 8, sample holder 16, first cover member 20, and second cover member 46. These items can be made of a same or different material. The material is compatible with radiation provided by and detected by an MRI device. Exemplary materials include a plastic such as ABS, polycarbonate, polyurethane, and the like. MRI phantom 2 and components thereof are produced by a process compatible for producing the exemplary materials, including three-dimensional printing, molding, extrusion, and the like. Molding includes injection molding, and three-dimensional printing includes, e.g., fused deposition, stereolithography, selective laser sintering, and the like. Additional components include and elastomer seal (that includes, e.g., an EPDM, Buna, Viton, polytetrafluoroethylene O-ring), fastener (that includes, e.g., a polyetheretherketone (PEEK), polyvinyl chloride, polytetrafluoroethylene, and the like), and the like.

The fluid disposed on MRI phantom 2 is a thermostatic fluid with a heat capacity to sustain substantially constant temperature when MRI phantom 2 is subjected to imaging. In a certain embodiment, a temperature of internal volume 10 of MRI phantom 2 is maintained at 0° C. by the fluid. According to an embodiment, the fluid is water. It is contemplated that when the fluid is at or approximately at a freezing temperature of the fluid, an equilibrium composition of a solid phase of the fluid and a liquid phase of the fluid may be present in interior volume 10 of MRI phantom 2. Accordingly, for water at 0° C., the fluid is referred to as ice water and includes solid phase water (ice) and liquid phase water. According to an embodiment, exchange of the fluid, same fluid or different fluid (e.g. fluorocarbon-based fluids), at a different temperature may be present to obtain thermal equilibrium at any temperature between the freezing and vaporization temperatures of the fluid. Further, obtaining thermal equilibrium of MRI phantom 2 and its contents ensures that a variation in a sample disposed in sample members in interior volume 10 obtained from data acquired by an MRI device is not due to a thermal effect, i.e., a change in temperature of the sample.

Fluid disposed on MRI phantom 2 may be introduced via a flow channel introduced into portion 6, or through fill port 18. This fluid may be temperature-controlled through an external device in order to regulate the temperature of MRI phantom 2 and its contents.

Sample member (e.g., 30 or 32 shown in FIG. 4) are disposed in sample receiver 22 of sample holder 16. Sample member 30 is configured to contain a sample to subjected to MRI imaging. Sample members can be a container such as a plastic vials and the like. The sample member can contain a sample such as a liquid, gel, solid, gas, and the like. Exemplary samples include biological samples (e.g., tissues, cells, and the like), liquids (e.g., water, alcohol, polymers, or a combination thereof, and the like including solutions). The liquids can be a solution that includes a selected concentration of an analyte. In an embodiment, the sample is a composition that includes solution of a polymer and water, wherein the sample is a standard surrogate for water having a rate of diffusion in a brain of, e.g., a human.

According to an embodiment, MRI phantom 2 includes a plurality of samples that provide a value for diffusion. Here, the sample members can be a plurality of vials, wherein each vial contains a unique concentration of a polymer (e.g., polyvinylpyrrolidone (PVP)) dissolved in water. The fluid disposed in internal volume 10 can be ice water to maintain a temperature of internal volume 10 and samples at 0° C. during MRI imaging of MRI phantom 2.

In an embodiment, a process for making MRI phantom 2 includes providing a mold for first portion 6; providing a mold for second portion 8; providing a mold for sample holder 16; providing a mold for first cover member 20; providing a mold for second cover member 46; disposing a polymer and each mold; curing the polymer in the molds to form first portion 6, second portion 8, sample holder 16, first cover member 20, and second cover member 46; removing first portion 6, second portion 8, sample holder 16, first cover member 20, and second cover member 46 from their respective mold; disposing sample holder 16 on second portion 8; disposing first portion 6 on sample holder 16 and second portion 8; attaching second cover member 46 to second portion 8; and attaching first cover member 20 to first portion 6 to form MRI Phantom 2.

According to an embodiment, the phantom is configured to be disposed in an MRI device and subjected to magnetic resonance imaging. Exemplary MRI devices include a body coil, head coil, and the like. In an embodiment, a field strength of the MRI device is, e.g., from 0.5 Tesla to 7 Tesla. MRI phantom 2 is rotatable and configured to be subjected to various MRI modalities that include coronal, sagittal, or axial imaging. In a certain embodiment, MRI phantom 2 is disposed in an arbitrary orientation in the MRI device.

According to an embodiment, a process for acquiring a magnetic resonance image includes providing MRI phantom 2; disposing a plurality of samples in sample members that are disposed in sample holder 16; disposing a fluid in internal volume 10 of MRI phantom 2; achieving thermal equilibrium of internal volume 10 at a selected temperature; and performing an MRI scan at the temperature under thermal equilibrium to acquire the magnetic resonance images of the plurality of samples. It is contemplated that images will be acquired using appropriate MRI scan sequences so as to generate parametric maps of physical parameters, e.g., diffusion-weighted images will be processed in order to generate spatial maps of the apparent diffusion coefficient.

It is contemplated that MRI phantom 2 can include samples of varying content and maintain a selected temperature of the samples (e.g., 0° C.), eliminating measurement variability due to a temperature difference across different MRI devices, different MRI centers, or between MRI image acquisitions that occur at different times, locations, or with different MRI devices.

MRI phantom 2 beneficially is configured to be subjected to MRI pulse sequences so that MRI phantom 2 is an article for quality control or quality assurance. In a particular embodiment, MRI phantom 2 houses samples of a polymer in an aqueous solution to tune an apparent diffusion coefficient (ADC) of water molecules. At 0° C., the ADC value can be established via a secondary method (such as pulsed field gradient nuclear magnetic resonance (NMR)) to provide comparison between the ADC value obtained in the MRI to an ADC reference value. Sample members in MRI phantom 2 can be substituted with alternate sample members that contain aqueous solutions where different MRI parameters of interest are tuned to a particular value. In an embodiment, aqueous solutions of paramagnetic ions in various concentrations (e.g., from 10 micromolar (μM) to 10000 μM) are included to change a relaxation time (e.g., T1 or T2) of the fluid, e.g., protons in the water molecule. The ice water bath used as the fluid disposed in internal volume 10 eliminates thermal variability, allowing direct comparison of data for relaxation time from one MRI device to another, from one experimental pulse sequence to another, or from one operator to another, without consideration of error introduced by temperature variation. Samples that include a non-aqueous composition, such as alcohols and ethers, are contemplated. The sample can include a liquid that includes protons ($^1$H) or other nuclides, and MRI phantom 2 can be disposed in an MRI head coil without size limitation and with or without the ice water bath as the fluid for temperature control. In addition to an aqueous polymer fluid or a paramagnetic ion-doped aqueous fluid, the fluid can include a gel, buffered solution, deuterated solution, solvent, and the like, or a combination thereof.

It has been found that MRI phantom 2 that includes a constant temperature fluid (e.g., ice water) in internal volume 10 advantageously eliminates thermal variation in measurement of magnetic resonance parameters across a plurality of MRI devices. Partitioning MRI phantom 2 into a plurality of sections provides easy disassembly for access to interior volume 10. According to an embodiment, the phantom includes easy reassembly and eliminates air bubbles.

A size of MRI phantom 2 is scalable and compatible to fit in an MRI coil, e.g., from 50 mm to 350 mm in outer diameter. An interior dimension of MRI phantom 2 can scale according to or independent of the outer diameter. An external shape of MRI phantom 2 can be spherical or spheroidal (e.g., oblate or prolate) although other shapes are contemplated, e.g., cylindrical and the like. For a spherical shape, the outer surface of MRI phantom 2 is smooth, and an outer diameter of MRI phantom 2 is a selected size to be received by an MRI device. According to an embodiment, MRI phantom 2 has an outer diameter that is less than an inner diameter of a sample space of the MRI device (e.g., where a subject would be received for acquisition of MRI imagery data), e.g., less than 300 mm, more specifically less than 200 mm, and yet more specifically less than 100 mm, and further specifically from 10 mm to 200 mm.

MRI phantom 2 has numerous advantages and benefits. Inclusion of the fluid with a substantially constant temperature substantially eliminates or reduces a thermal variation so that MRI measurements include properties of the sample and are not due to a temperature variation of MRI phantom 2. Further, MRI phantom 2 provides for characterization of MRI device performance such as by establishing reference values for samples that are derived from a secondary measurement technique such as NMR. It is contemplated that MRI phantom 2 is operable in quantitative imaging wherein a parametric map of a selected quantity (e.g., ADC, T1, T2, T2*, magnetic susceptibility, flow rate, temperature, electrical conductivity, dielectric constant, NMR chemical shifts and the like) is produced from a selected MRI pulse sequence or data analysis. According to an embodiment, spatial variation of a given measurand is characterized in an absence of a temperature gradient. As a result, pulse sequences for MRI devices, post-processing of imagery data from MRI measurements, and other techniques are developed rapidly and mitigate or eliminate bias. According to an embodiment, MRI phantom 2 is used to characterize a fast T1-mapping technique, e.g., a variable flip angle, as a function of position by filling MRI phantom 2 with a plurality of sample members that contain a composition that includes a known concentration of a paramagnetic ion and an aqueous solvent. By characterizing a T1 value obtained from the composition using MRI phantom 2 in an MRI device against T1 values of the composition obtained from a separate measurement (e.g., data obtained from an NMR spectrometer), a process for optimizing an MRI-based technique for measuring such parameters includes changing an experimental condition used when obtaining MRI-based data using MRI phantom 2, evaluating MRI-based data, optionally evaluating NMR-based data, and iteratively changing experimental conditions to optimize the MRI-based technique.

The articles and processes herein are illustrated further by the following Examples, which are non-limiting.

EXAMPLES

Example 1. MRI Phantom and Samples

Figure 48:
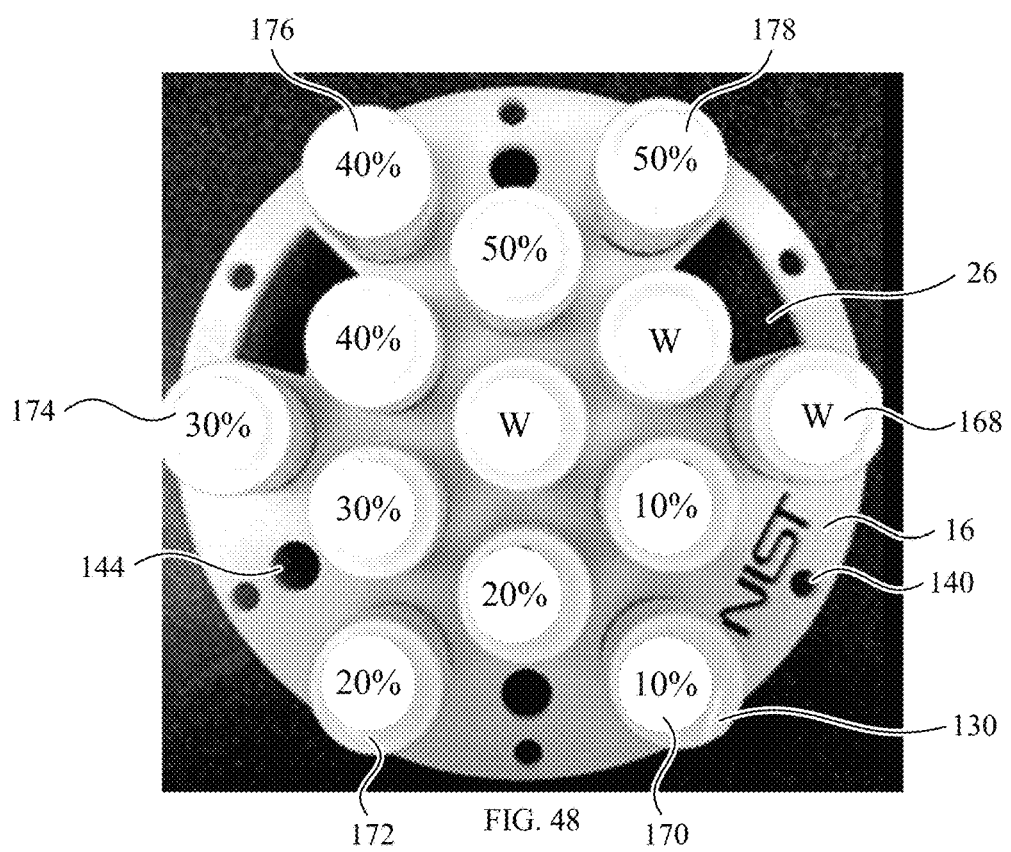
FIG. 48 shows a photograph of sample members disposed in a sample holder according to Example 1.
Figure 49:
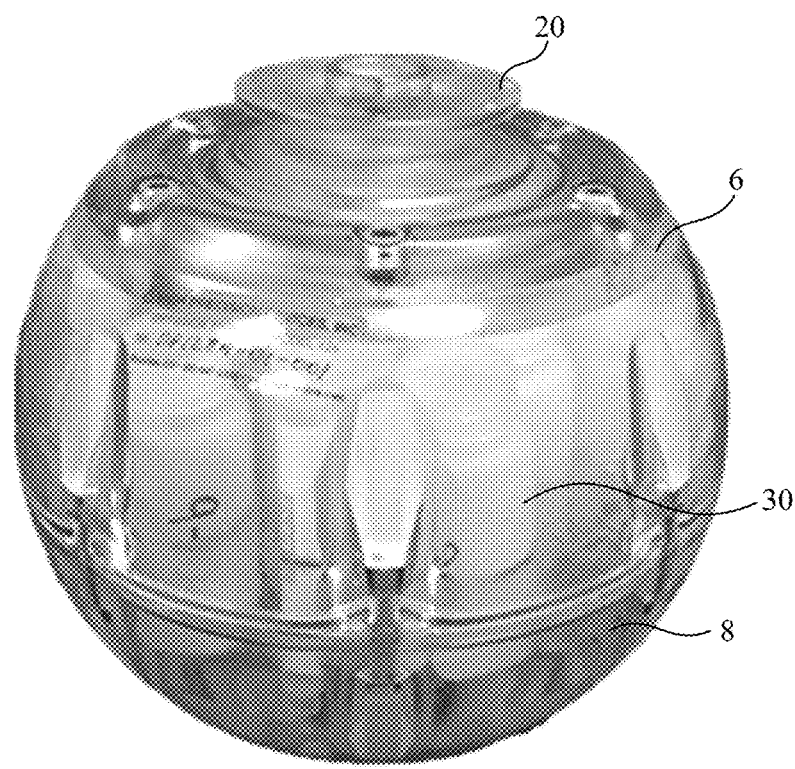
FIG. 49 shows a photograph of an MRI phantom according to Example 1.

A stock solution was made by dissolving PVP in water to obtain a concentration 50 weight percent (wt %) PVP, based on a total weight of PVP and water. Conical vials were used as sample members 30 (shown in FIGS. 48 and 49) in which a portion of stock solution was added and diluted with water to obtain a sample having a selected concentration of PVP. Samples made are shown in Table 1.

TABLE 1

Figure 51:
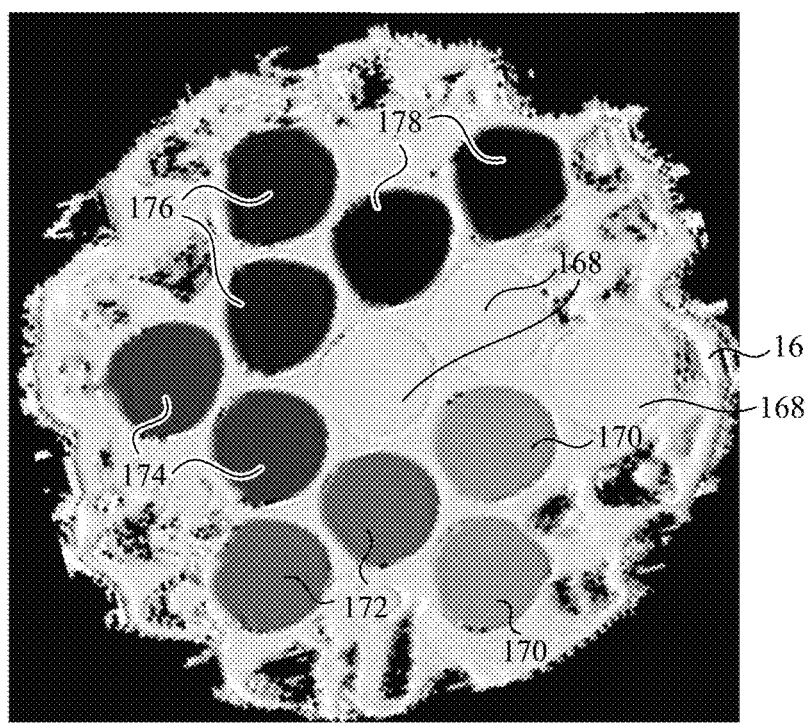
FIG. 51 shows an MRI image of the MRI phantom shown in FIG. 49 according to Example 2.

| Sample member (shown in FIG. 48 and FIG. 51) | wt % PVP | wt % water |
| --- | --- | --- |
| 168 | 0 | 100 |
| 170 | 10 | 90 |
| 172 | 20 | 80 |
| 174 | 30 | 70 |
| 176 | 40 | 60 |
| 178 | 50 | 50 |

Sample members (168, 170, 172, 174, 176, 178) are disposed in sample holder 16, which was disposed on second portion 8. First portion 6 was disposed on the sample holder 16 and second portion 8, and second cover 46 and first cover 20 respectively were attached to second portion 8 and first portion 6. Ice water was introduced into interior volume 10 of MRI phantom 2, and MRI phantom 2 was sealed by inserting a plug into cover member 20.

Example 2. MRI Image

Figure 50:
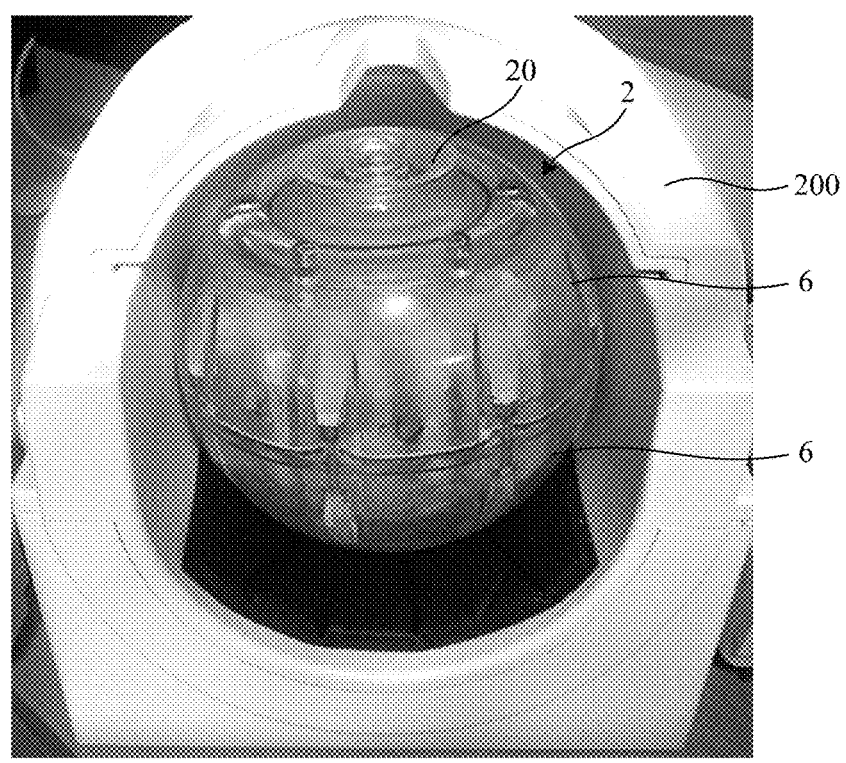
FIG. 50 shows a photograph of the MRI phantom shown in FIG. 48 disposed in a head coil of an MRI device according to Example 2.

The MRI phantom of Example 1 that included the samples and ice water was allowed to thermally equilibrate to the temperature of the ice water. Thereafter, as shown in FIG. 50, the MRI phantom was disposed in an MRI device 200 and subjected to imaging to obtain (e.g., calculate) the image shown in FIG. 51. Here, sample members (168, 170, 172, 174, 176, 178) exhibit contrast differences that depend on an amount of PVP present in the samples.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A magnetic resonance imaging (MRI) phantom comprising
    an outer container comprising:
        a first portion comprising a first wall;
        a second portion opposingly disposed to the first portion and sealingly engaged to the first portion, the second portion comprising a second wall; and
        an internal volume bounded by the first wall and the second wall, the internal volume being hollow and configured to receive a fluid;
    a sample holder disposed in the internal volume of the outer container;
    a first sealing surface to form a seal in combination with the second portion;
    a first fill port distal to the first sealing surface;
    a first cover member disposed on the first portion to cover the first fill port,
    wherein the second portion further comprises:
        a second sealing surface to form the seal in combination with the first portion; and
        a second fill port distal to the second sealing surface;
    a second cover member disposed on the second portion to cover the second fill port, and
    a plurality of fasteners to engagingly fasten the first portion to the second portion and to immobilize the sample holder in the internal volume,
    wherein the MRI phantom is configured to maintain a constant temperature of the internal volume.

2. The MRI phantom of claim 1, wherein the first cover comprises a flow channel.

3. The MRI phantom of claim 2, wherein the second cover comprises a flow channel.

4. The MRI phantom of claim 2, wherein the second portion further comprises a gland bounded by gland wall and configured to receive a sealing material, the gland and the gland wall being disposed on the second sealing surface.

5. The MRI phantom of claim 4, wherein the sealing material comprises an O-ring, gasket, or combination comprising at least one of the foregoing sealing materials.

6. The MRI phantom of claim 4, wherein the second portion further comprises a tab; and a hole disposed in the tab and bounded by a wall, the tab being configured to receive a fastener and to engage the sample holder.

7. The MRI phantom of claim 1, wherein the sample holder comprises a sample receiver to receive a sample member.

8. The MRI phantom of claim 7, wherein the sample holder further comprises a flow member to communicate the fluid between the first portion and the second portion.

9. The MRI phantom of claim 8, wherein the sample holder is interposed between the first portion and the second portion such that the first portion forms a first seal with a first surface of the sample holder, and the second portion forms a second seal with a second surface of the sample holder.

10. The MRI phantom of claim 7, wherein the sample holder further comprises a plurality of platforms spaced apart by a spacer.

11. The MRI phantom of claim 7, further comprising the sample member that is configured to receive a sample, the MRI phantom being configured to be subjected to magnetic resonance imaging and a determination of:

an apparent diffusion coefficient of the sample; an anisotropic diffusion property of the sample; a T1 relaxation time of the sample; a T2 relaxation time of the sample; a T2* relaxation time of the sample; a magnetic susceptibility of the sample; a flow of a fluid in the sample; a perfusion of the fluid in the sample; a conductivity of the sample; a dielectric constant of the sample; a temperature of the sample; an NMR spectrum of the sample; an NMR chemical shift of the sample of the sample; or a combination comprising at least one of the foregoing.

* * * * *